(12) United States Patent
Liang et al.

(10) Patent No.: US 7,169,619 B2
(45) Date of Patent: Jan. 30, 2007

(54) METHOD FOR FABRICATING SEMICONDUCTOR STRUCTURES ON VICINAL SUBSTRATES USING A LOW TEMPERATURE, LOW PRESSURE, ALKALINE EARTH METAL-RICH PROCESS

(75) Inventors: Yong Liang, Gilbert, AZ (US); Ravindranath Droopad, Chandler, AZ (US); Xiaoming Hu, Chandler, AZ (US); Jun Wang, Gilbert, AZ (US); Yi Wei, Chandler, AZ (US); Zhiyi Yu, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 275 days.

(21) Appl. No.: 10/299,246

(22) Filed: Nov. 19, 2002

(65) Prior Publication Data

US 2004/0097096 A1    May 20, 2004

(51) Int. Cl.
*H01L 21/00*    (2006.01)
(52) U.S. Cl. .......................................................... 438/3
(58) Field of Classification Search ........ 438/792–793, 438/3; 117/84, 85, 106; 257/532
See application file for complete search history.

(56) References Cited

U.S. PATENT DOCUMENTS

| | | | |
|---|---|---|---|
| 3,617,951 A | 11/1971 | Anderson | |
| 3,670,213 A | 6/1972 | Nakawaga et al. | |
| 3,758,199 A | 9/1973 | Thaxter | |
| 3,766,370 A | 10/1973 | Walther | |
| 3,802,967 A | 4/1974 | Ladany et al. | |
| 3,818,451 A | 6/1974 | Coleman | |
| 3,914,137 A | 10/1975 | Huffman et al. | |
| 3,935,031 A | 1/1976 | Adler | |
| 4,006,989 A | 2/1977 | Andringa | |
| 4,084,130 A | 4/1978 | Holton | |
| 4,120,588 A | 10/1978 | Chaum | |
| 4,146,297 A | 3/1979 | Alferness et al. | |
| 4,174,422 A | 11/1979 | Matthews et al. | |

(Continued)

FOREIGN PATENT DOCUMENTS

DE    196 07 107    8/1997

(Continued)

OTHER PUBLICATIONS

Kitano Y. et al., "Thin Film Crystal Growth Of BaZrO3 at Low Oxygen Partial Pressure", Journal of Crystal Growth, 2002, 243(1), pp. 164-169.*

(Continued)

*Primary Examiner*—Richard A. Booth
(74) *Attorney, Agent, or Firm*—Oblon, Spivak, McClelland, Maier & Neustadt, P.C.

(57) ABSTRACT

High quality epitaxial layers of monocrystalline oxide materials (24) can be grown overlying monocrystalline substrates (22) such as large silicon wafers. The monocrystalline oxide layer (24) comprises a layer of monocrystalline oxide spaced apart from the silicon wafer by an amorphous interface layer (28) of silicon oxide. The amorphous interface layer serves as a decoupling layer between the substrate and the buffer layer so that the substrate and the buffer is crystal-graphically, chemically, and dielectrically decoupled. In addition, high quality epitaxial accommodating buffer layers may be formed overlying vicinal substrates using a low pressure, low temperature, alkaline-earth metal-rich process.

8 Claims, 3 Drawing Sheets

U.S. PATENT DOCUMENTS

| | | |
|---|---|---|
| 4,174,504 A | 11/1979 | Chenausky et al. |
| 4,177,094 A | 12/1979 | Kroon |
| 4,242,595 A | 12/1980 | Lehovec |
| 4,284,329 A | 8/1981 | Smith et al. |
| 4,289,920 A | 9/1981 | Hovel |
| 4,297,656 A | 10/1981 | Pan |
| 4,298,247 A | 11/1981 | Michelet et al. |
| 4,378,259 A | 3/1983 | Hasegawa et al. |
| 4,392,297 A | 7/1983 | Little |
| 4,398,342 A | 8/1983 | Pitt et al. |
| 4,404,265 A | 9/1983 | Manasevit |
| 4,424,589 A | 1/1984 | Thomas et al. |
| 4,439,014 A | 3/1984 | Stacy et al. |
| 4,442,590 A | 4/1984 | Stockton et al. |
| 4,447,116 A | 5/1984 | King et al. |
| 4,452,720 A | 6/1984 | Harada et al. |
| 4,459,325 A | 7/1984 | Nozawa et al. |
| 4,482,422 A | 11/1984 | McGinn et al. |
| 4,482,906 A | 11/1984 | Hovel et al. |
| 4,484,332 A | 11/1984 | Hawrylo |
| 4,503,540 A | 3/1985 | Nakashima et al. |
| 4,523,211 A | 6/1985 | Morimoto et al. |
| 4,525,871 A | 6/1985 | Foyt et al. |
| 4,594,000 A | 6/1986 | Falk et al. |
| 4,626,878 A | 12/1986 | Kuwano et al. |
| 4,629,821 A | 12/1986 | Bronstein-Bonte et al. |
| 4,661,176 A | 4/1987 | Manasevit |
| 4,667,088 A | 5/1987 | Kramer |
| 4,667,212 A | 5/1987 | Nakamura |
| 4,681,982 A | 7/1987 | Yoshida |
| 4,695,120 A | 9/1987 | Holder |
| 4,723,321 A | 2/1988 | Saleh |
| 4,748,485 A | 5/1988 | Vasudev |
| 4,756,007 A | 7/1988 | Qureshi et al. |
| 4,772,929 A | 9/1988 | Manchester et al. |
| 4,773,063 A | 9/1988 | Hunsperger et al. |
| 4,774,205 A | 9/1988 | Choi et al. |
| 4,777,613 A | 10/1988 | Shahan et al. |
| 4,793,872 A | 12/1988 | Meunier et al. |
| 4,801,184 A | 1/1989 | Revelli |
| 4,802,182 A | 1/1989 | Thornton et al. |
| 4,804,866 A | 2/1989 | Akiyama |
| 4,815,084 A | 3/1989 | Scifres et al. |
| 4,841,775 A | 6/1989 | Ikeda et al. |
| 4,843,609 A | 6/1989 | Ohya et al. |
| 4,845,044 A | 7/1989 | Ariyoshi et al. |
| 4,846,926 A | 7/1989 | Kay et al. |
| 4,855,249 A | 8/1989 | Akasaki et al. |
| 4,866,489 A | 9/1989 | Yokogawa et al. |
| 4,868,376 A | 9/1989 | Lessin et al. |
| 4,872,046 A | 10/1989 | Morkoc et al. |
| 4,876,208 A | 10/1989 | Gustafson et al. |
| 4,876,218 A | 10/1989 | Pessa et al. |
| 4,876,219 A | 10/1989 | Eshita et al. |
| 4,882,300 A | 11/1989 | Inoue et al. |
| 4,885,376 A | 12/1989 | Verkade |
| 4,888,202 A | 12/1989 | Murakami et al. |
| 4,889,402 A | 12/1989 | Reinhart |
| 4,891,091 A | 1/1990 | Shastry |
| 4,896,194 A | 1/1990 | Suzuki |
| 4,901,133 A | 2/1990 | Curran et al. |
| 4,910,164 A | 3/1990 | Shichijo |
| 4,912,087 A | 3/1990 | Aslam et al. |
| 4,928,154 A | 5/1990 | Umeno et al. |
| 4,934,777 A | 6/1990 | Jou et al. |
| 4,952,420 A | 8/1990 | Walters |
| 4,959,702 A | 9/1990 | Moyer et al. |
| 4,963,508 A | 10/1990 | Umeno et al. |
| 4,963,949 A | 10/1990 | Wanlass et al. |
| 4,965,649 A | 10/1990 | Zanio et al. |
| 4,981,714 A | 1/1991 | Ohno et al. |
| 4,984,043 A | 1/1991 | Vinal |
| 4,999,842 A | 3/1991 | Huang et al. |
| 5,018,816 A | 5/1991 | Murray et al. |
| 5,028,976 A | 7/1991 | Ozaki et al. |
| 5,051,790 A | 9/1991 | Hammer |
| 5,053,835 A | 10/1991 | Horikawa et al. |
| 5,055,445 A | 10/1991 | Belt et al. |
| 5,055,835 A | 10/1991 | Sutton |
| 5,057,694 A | 10/1991 | Idaka et al. |
| 5,060,031 A | 10/1991 | Abrokwah et al. |
| 5,063,081 A | 11/1991 | Cozzette et al. |
| 5,063,166 A | 11/1991 | Mooney et al. |
| 5,064,781 A | 11/1991 | Cambou et al. |
| 5,067,809 A | 11/1991 | Tsubota |
| 5,073,981 A | 12/1991 | Giles et al. |
| 5,075,743 A | 12/1991 | Behfar-Rad |
| 5,081,062 A | 1/1992 | Vasudev et al. |
| 5,081,519 A | 1/1992 | Nishimura et al. |
| 5,087,829 A | 2/1992 | Ishibashi et al. |
| 5,103,494 A | 4/1992 | Mozer |
| 5,116,461 A | 5/1992 | Lebby et al. |
| 5,119,448 A | 6/1992 | Schaefer et al. |
| 5,122,679 A | 6/1992 | Ishii et al. |
| 5,122,852 A | 6/1992 | Chan et al. |
| 5,127,067 A | 6/1992 | Delcoco et al. |
| 5,130,762 A | 7/1992 | Kulick |
| 5,132,648 A | 7/1992 | Trinh et al. |
| 5,140,387 A | 8/1992 | Okazaki et al. |
| 5,140,651 A | 8/1992 | Soref et al. |
| 5,141,894 A | 8/1992 | Bisaro et al. |
| 5,143,854 A | 9/1992 | Pirrung et al. |
| 5,144,409 A | 9/1992 | Ma |
| 5,148,504 A | 9/1992 | Levi et al. |
| 5,155,658 A | 10/1992 | Inam et al. |
| 5,159,413 A | 10/1992 | Calviello et al. |
| 5,163,118 A | 11/1992 | Lorenzo et al. |
| 5,166,761 A | 11/1992 | Olson et al. |
| 5,173,474 A | 12/1992 | Connell et al. |
| 5,173,835 A | 12/1992 | Cornett et al. |
| 5,181,085 A | 1/1993 | Moon et al. |
| 5,185,589 A | 2/1993 | Krishnaswamy et al. |
| 5,188,976 A | 2/1993 | Kume et al. |
| 5,191,625 A | 3/1993 | Gustavsson |
| 5,194,397 A | 3/1993 | Cook et al. |
| 5,194,917 A | 3/1993 | Regener |
| 5,198,269 A | 3/1993 | Swartz et al. |
| 5,208,182 A | 5/1993 | Narayan et al. |
| 5,210,763 A | 5/1993 | Lewis et al. |
| 5,216,359 A | 6/1993 | Makki et al. |
| 5,216,729 A | 6/1993 | Berger et al. |
| 5,221,367 A | 6/1993 | Chisholm et al. |
| 5,225,031 A | 7/1993 | McKee et al. |
| 5,227,196 A | 7/1993 | Itoh |
| 5,238,877 A | 8/1993 | Russell |
| 5,244,818 A | 9/1993 | Jokers et al. |
| 5,248,564 A | 9/1993 | Ramesh |
| 5,260,394 A | 11/1993 | Tazaki et al. |
| 5,262,659 A | 11/1993 | Grudkowski et al. |
| 5,266,355 A | 11/1993 | Wernberg et al. |
| 5,268,327 A | 12/1993 | Vernon |
| 5,270,298 A | 12/1993 | Ramesh |
| 5,280,013 A | 1/1994 | Newman et al. |
| 5,281,834 A | 1/1994 | Cambou et al. |
| 5,283,462 A | 2/1994 | Stengel |
| 5,286,985 A | 2/1994 | Taddiken |
| 5,293,050 A | 3/1994 | Chapple-Sokol et al. |
| 5,306,649 A | 4/1994 | Hebert |
| 5,310,707 A | 5/1994 | Oishi et al. |
| 5,312,765 A | 5/1994 | Kanber |
| 5,313,058 A | 5/1994 | Friederich et al. |
| 5,314,547 A | 5/1994 | Heremans et al. |
| 5,315,128 A | 5/1994 | Hunt et al. |
| 5,323,023 A | 6/1994 | Fork |

| | | | | | |
|---|---|---|---|---|---|
| 5,326,721 A | 7/1994 | Summerfelt | 5,540,785 A | 7/1996 | Dennard et al. |
| 5,334,556 A | 8/1994 | Guldi | 5,541,422 A | 7/1996 | Wolf et al. |
| 5,352,926 A | 10/1994 | Andrews | 5,548,141 A | 8/1996 | Morris et al. |
| 5,356,509 A | 10/1994 | Terranova et al. | 5,549,977 A | 8/1996 | Jin et al. |
| 5,356,831 A | 10/1994 | Calviello et al. | 5,551,238 A | 9/1996 | Prueitt |
| 5,357,122 A | 10/1994 | Okubora et al. | 5,552,547 A | 9/1996 | Shi |
| 5,358,925 A | 10/1994 | Neville Connell et al. | 5,553,089 A | 9/1996 | Seki et al. |
| 5,362,998 A | 11/1994 | Iwamura et al. | 5,556,463 A | 9/1996 | Guenzer |
| 5,365,477 A | 11/1994 | Cooper, Jr. et al. | 5,559,368 A | 9/1996 | Hu et al. |
| 5,371,621 A | 12/1994 | Stevens | 5,561,305 A | 10/1996 | Smith |
| 5,371,734 A | 12/1994 | Fischer | 5,569,953 A | 10/1996 | Kikkawa et al. |
| 5,372,992 A | 12/1994 | Itozaki et al. | 5,570,226 A | 10/1996 | Ota |
| 5,373,166 A | 12/1994 | Buchan et al. | 5,572,052 A | 11/1996 | Kashihara et al. |
| 5,387,811 A | 2/1995 | Saigoh | 5,574,296 A | 11/1996 | Park et al. |
| 5,391,515 A | 2/1995 | Kao et al. | 5,574,589 A | 11/1996 | Feuer et al. |
| 5,393,352 A | 2/1995 | Summerfelt | 5,574,744 A | 11/1996 | Gaw et al. |
| 5,394,489 A | 2/1995 | Koch | 5,576,879 A | 11/1996 | Nashimoto |
| 5,395,663 A | 3/1995 | Tabata et al. | 5,578,162 A | 11/1996 | D'Asaro et al. |
| 5,397,428 A | 3/1995 | Stoner et al. | 5,585,167 A | 12/1996 | Satoh et al. |
| 5,399,898 A | 3/1995 | Rostoker | 5,585,288 A | 12/1996 | Davis et al. |
| 5,404,581 A | 4/1995 | Honjo | 5,588,995 A | 12/1996 | Sheldon |
| 5,405,802 A | 4/1995 | Yamagata et al. | 5,589,284 A | 12/1996 | Summerfelt et al. |
| 5,406,202 A | 4/1995 | Mehrgardt et al. | 5,596,205 A | 1/1997 | Reedy et al. |
| 5,410,622 A | 4/1995 | Okada et al. | 5,596,214 A | 1/1997 | Endo |
| 5,418,216 A | 5/1995 | Fork | 5,602,418 A | 2/1997 | Imai et al. |
| 5,418,389 A | 5/1995 | Watanabe | 5,603,764 A | 2/1997 | Matsuda et al. |
| 5,420,102 A | 5/1995 | Harshavardhan et al. | 5,606,184 A | 2/1997 | Abrokwah et al. |
| 5,427,988 A | 6/1995 | Sengupta et al. | 5,608,046 A | 3/1997 | Cook et al. |
| 5,430,397 A | 7/1995 | Itoh et al. | 5,610,744 A | 3/1997 | Ho et al. |
| 5,436,759 A | 7/1995 | Dijaili et al. | 5,614,739 A | 3/1997 | Abrokwah et al. |
| 5,438,584 A | 8/1995 | Paoli et al. | 5,619,051 A | 4/1997 | Endo |
| 5,441,577 A | 8/1995 | Sasaki et al. | 5,621,227 A | 4/1997 | Joshi |
| 5,442,191 A | 8/1995 | Ma | 5,623,439 A | 4/1997 | Gotoh et al. |
| 5,442,561 A | 8/1995 | Yoshizawa et al. | 5,623,552 A | 4/1997 | Lane |
| 5,444,016 A | 8/1995 | Abrokwah et al. | 5,629,534 A | 5/1997 | Inuzuka et al. |
| 5,446,719 A | 8/1995 | Yoshida et al. | 5,633,724 A | 5/1997 | King et al. |
| 5,450,812 A | 9/1995 | McKee et al. | 5,635,433 A | 6/1997 | Sengupta |
| 5,452,118 A | 9/1995 | Maruska | 5,635,453 A | 6/1997 | Pique et al. |
| 5,453,727 A | 9/1995 | Shibasaki et al. | 5,640,267 A | 6/1997 | May et al. |
| 5,466,631 A | 11/1995 | Ichikawa et al. | 5,642,371 A | 6/1997 | Tohyama et al. |
| 5,473,047 A | 12/1995 | Shi | 5,650,646 A | 7/1997 | Summerfelt |
| 5,473,171 A | 12/1995 | Summerfelt | 5,656,382 A | 8/1997 | Nashimoto |
| 5,477,363 A | 12/1995 | Matsuda | 5,659,180 A | 8/1997 | Shen et al. |
| 5,478,653 A | 12/1995 | Guenzer | 5,661,112 A | 8/1997 | Hatta et al. |
| 5,479,033 A | 12/1995 | Baca et al. | 5,666,376 A | 9/1997 | Cheng |
| 5,479,317 A | 12/1995 | Ramesh | 5,667,586 A | 9/1997 | Ek et al. |
| 5,480,829 A | 1/1996 | Abrokwah et al. | 5,668,048 A | 9/1997 | Kondo et al. |
| 5,481,102 A | 1/1996 | Hazelrigg, Jr. | 5,670,798 A | 9/1997 | Schetzina |
| 5,482,003 A | 1/1996 | McKee et al. | 5,670,800 A | 9/1997 | Nakao et al. |
| 5,484,664 A | 1/1996 | Kitahara et al. | 5,674,366 A | 10/1997 | Hayashi et al. |
| 5,486,406 A | 1/1996 | Shi | 5,674,813 A | 10/1997 | Nakamura et al. |
| 5,491,461 A | 2/1996 | Partin et al. | 5,679,947 A | 10/1997 | Doi et al. |
| 5,492,859 A | 2/1996 | Sakaguchi et al. | 5,679,965 A | 10/1997 | Schetzina |
| 5,494,711 A | 2/1996 | Takeda et al. | 5,682,046 A | 10/1997 | Takahashi et al. |
| 5,504,035 A | 4/1996 | Rostoker et al. | 5,684,302 A | 11/1997 | Wersing et al. |
| 5,504,183 A | 4/1996 | Shi et al. | 5,686,741 A | 11/1997 | Ohori et al. |
| 5,508,554 A | 4/1996 | Takatani et al. | 5,689,123 A | 11/1997 | Major et al. |
| 5,510,665 A | 4/1996 | Conley | 5,693,140 A | 12/1997 | McKee et al. |
| 5,511,238 A | 4/1996 | Bayraktaroglu | 5,696,392 A | 12/1997 | Char et al. |
| 5,512,773 A | 4/1996 | Wolf et al. | 5,719,417 A | 2/1998 | Roeder et al. |
| 5,514,484 A | 5/1996 | Nashimoto | 5,725,641 A | 3/1998 | MacLeod |
| 5,514,904 A | 5/1996 | Onga et al. | 5,729,394 A | 3/1998 | Sevier et al. |
| 5,515,047 A | 5/1996 | Yamakido et al. | 5,729,641 A | 3/1998 | Chandonnet et al. |
| 5,515,810 A | 5/1996 | Yamashita et al. | 5,731,220 A | 3/1998 | Tsu et al. |
| 5,516,725 A | 5/1996 | Chang et al. | 5,733,641 A | 3/1998 | Fork et al. |
| 5,519,235 A | 5/1996 | Ramesh | 5,734,672 A | 3/1998 | McMinn et al. |
| 5,523,602 A | 6/1996 | Horiuchi et al. | 5,735,949 A | 4/1998 | Mantl et al. |
| 5,528,057 A | 6/1996 | Yanagase et al. | 5,741,724 A | 4/1998 | Ramdani et al. |
| 5,528,067 A | 6/1996 | Farb et al. | 5,745,631 A | 4/1998 | Reinker |
| 5,528,209 A | 6/1996 | Macdonald et al. | 5,753,300 A | 5/1998 | Wessels et al. |
| 5,528,414 A | 6/1996 | Oakley | 5,753,928 A | 5/1998 | Krause |
| 5,530,235 A | 6/1996 | Stefik et al. | 5,753,934 A | 5/1998 | Yano et al. |
| 5,538,941 A | 7/1996 | Findikoglu et al. | 5,754,319 A | 5/1998 | Van De Voorde et al. |

| | | | | | |
|---|---|---|---|---|---|
| 5,754,714 A | 5/1998 | Suzuki et al. | 5,963,291 A | 10/1999 | Wu et al. |
| 5,760,426 A | 6/1998 | Marx et al. | 5,966,323 A | 10/1999 | Chen et al. |
| 5,760,427 A | 6/1998 | Onda | 5,976,953 A | 11/1999 | Zavracky et al. |
| 5,760,740 A | 6/1998 | Blodgett | 5,977,567 A | 11/1999 | Verdiell |
| 5,764,676 A | 6/1998 | Paoli et al. | 5,981,400 A | 11/1999 | Lo |
| 5,767,543 A | 6/1998 | Ooms et al. | 5,981,976 A | 11/1999 | Murasato |
| 5,770,887 A | 6/1998 | Tadatomo et al. | 5,981,980 A | 11/1999 | Miyajima et al. |
| 5,772,758 A | 6/1998 | Collins et al. | 5,984,190 A | 11/1999 | Nevill |
| 5,776,359 A | 7/1998 | Schultz et al. | 5,985,404 A | 11/1999 | Yano et al. |
| 5,776,621 A | 7/1998 | Nashimoto | 5,986,301 A | 11/1999 | Fukushima et al. |
| 5,777,350 A | 7/1998 | Nakamura et al. | 5,987,011 A | 11/1999 | Toh |
| 5,777,762 A | 7/1998 | Yamamoto | 5,987,196 A | 11/1999 | Noble |
| 5,778,018 A | 7/1998 | Yoshikawa et al. | 5,990,495 A | 11/1999 | Ohba |
| 5,778,116 A | 7/1998 | Tomich | 5,995,359 A | 11/1999 | Klee et al. |
| 5,780,311 A | 7/1998 | Beasom et al. | 5,995,528 A | 11/1999 | Fukunaga et al. |
| 5,789,733 A | 8/1998 | Jachimowicz et al. | 5,997,638 A | 12/1999 | Copel et al. |
| 5,789,845 A | 8/1998 | Wadaka et al. | 5,998,781 A | 12/1999 | Vawter et al. |
| 5,790,583 A | 8/1998 | Ho | 5,998,819 A | 12/1999 | Yokoyama et al. |
| 5,792,569 A | 8/1998 | Sun et al. | 6,002,375 A | 12/1999 | Corman et al. |
| 5,792,679 A | 8/1998 | Nakato | 6,008,762 A | 12/1999 | Nghiem |
| 5,796,648 A | 8/1998 | Kawakubo et al. | 6,011,641 A | 1/2000 | Shin et al. |
| 5,801,072 A | 9/1998 | Barber | 6,011,646 A | 1/2000 | Mirkarimi et al. |
| 5,801,105 A | 9/1998 | Yano et al. | 6,013,553 A | 1/2000 | Wallace et al. |
| 5,807,440 A | 9/1998 | Kubota et al. | 6,020,222 A | 2/2000 | Wollesen |
| 5,810,923 A | 9/1998 | Yano et al. | 6,022,140 A | 2/2000 | Fraden et al. |
| 5,812,272 A | 9/1998 | King et al. | 6,022,410 A | 2/2000 | Yu et al. |
| 5,814,583 A | 9/1998 | Itozaki et al. | 6,022,671 A | 2/2000 | Binkley et al. |
| 5,825,055 A | 10/1998 | Summerfelt | 6,022,963 A | 2/2000 | McGall et al. |
| 5,825,799 A | 10/1998 | Ho et al. | 6,023,082 A | 2/2000 | McKee et al. |
| 5,827,755 A | 10/1998 | Yonchara et al. | 6,028,853 A | 2/2000 | Haartsen |
| 5,828,080 A | 10/1998 | Yano et al. | 6,039,803 A | 3/2000 | Fitzgerald et al. |
| 5,830,270 A | 11/1998 | McKee et al. | 6,045,626 A | 4/2000 | Yano et al. |
| 5,831,960 A | 11/1998 | Jiang et al. | 6,046,464 A | 4/2000 | Schetzina |
| 5,833,603 A | 11/1998 | Kovacs et al. | 6,048,751 A | 4/2000 | D'Asaro et al. |
| 5,834,362 A | 11/1998 | Miyagaki et al. | 6,049,110 A | 4/2000 | Koh |
| 5,838,035 A | 11/1998 | Ramesh | 6,049,702 A | 4/2000 | Tham et al. |
| 5,838,053 A | 11/1998 | Bevan et al. | 6,051,858 A | 4/2000 | Uchida et al. |
| 5,844,260 A | 12/1998 | Ohori | 6,051,874 A | 4/2000 | Masuda |
| 5,846,846 A | 12/1998 | Suh et al. | 6,055,179 A | 4/2000 | Koganei et al. |
| 5,852,687 A | 12/1998 | Wickham | 6,058,131 A | 5/2000 | Pan |
| 5,857,049 A | 1/1999 | Beranek et al. | 6,059,895 A | 5/2000 | Chu et al. |
| 5,858,814 A | 1/1999 | Goossen et al. | 6,064,078 A | 5/2000 | Northrup et al. |
| 5,861,966 A | 1/1999 | Ortel | 6,064,092 A | 5/2000 | Park |
| 5,863,326 A | 1/1999 | Nause et al. | 6,064,783 A | 5/2000 | Congdon et al. |
| 5,869,845 A | 2/1999 | Vander Wagt et al. | 6,078,717 A | 6/2000 | Nashimoto et al. |
| 5,872,493 A | 2/1999 | Ella | 6,080,378 A | 6/2000 | Yokota et al. |
| 5,873,977 A | 2/1999 | Desu et al. | 6,083,697 A | 7/2000 | Beecher et al. |
| 5,874,860 A | 2/1999 | Brunel et al. | 6,087,681 A | 7/2000 | Shakuda |
| 5,878,175 A | 3/1999 | Sonoda et al. | 6,088,216 A | 7/2000 | Laibowitz et al. |
| 5,879,956 A | 3/1999 | Seon et al. | 6,090,659 A | 7/2000 | Laibowitz et al. |
| 5,880,452 A | 3/1999 | Plesko | 6,093,302 A | 7/2000 | Montgomery |
| 5,882,948 A | 3/1999 | Jewell | 6,096,584 A | 8/2000 | Ellis-Monaghan et al. |
| 5,883,564 A | 3/1999 | Partin | 6,100,578 A | 8/2000 | Suzuki |
| 5,883,996 A | 3/1999 | Knapp et al. | 6,103,008 A | 8/2000 | McKee et al. |
| 5,886,867 A | 3/1999 | Chivukula et al. | 6,103,403 A | 8/2000 | Grigorian et al. |
| 5,888,296 A | 3/1999 | Ooms et al. | 6,107,653 A | 8/2000 | Fitzgerald |
| 5,889,296 A | 3/1999 | Imamura et al. | 6,107,721 A | 8/2000 | Lakin |
| 5,896,476 A | 4/1999 | Wisseman et al. | 6,108,125 A | 8/2000 | Yano |
| 5,905,571 A | 5/1999 | Butler et al. | 6,110,813 A | 8/2000 | Ota et al. |
| 5,907,792 A | 5/1999 | Droopad et al. | 6,110,840 A | 8/2000 | Yu |
| 5,912,068 A | 6/1999 | Jia | 6,113,225 A | 9/2000 | Miyata et al. |
| 5,919,515 A | 7/1999 | Yano et al. | 6,113,690 A | 9/2000 | Yu et al. |
| 5,919,522 A | 7/1999 | Baum et al. | 6,114,996 A | 9/2000 | Nghiem |
| 5,926,493 A | 7/1999 | O'Brien et al. | 6,121,642 A | 9/2000 | Newns |
| 5,926,496 A | 7/1999 | Ho et al. | 6,121,647 A | 9/2000 | Yano et al. |
| 5,937,274 A | 8/1999 | Kondow et al. | 6,128,178 A | 10/2000 | Newns |
| 5,937,285 A | 8/1999 | Abrokwah et al. | 6,134,114 A | 10/2000 | Ungermann et al. |
| 5,948,161 A | 9/1999 | Kizuki | 6,136,666 A | 10/2000 | So |
| 5,953,468 A | 9/1999 | Finnila et al. | 6,137,603 A | 10/2000 | Henmi |
| 5,955,591 A | 9/1999 | Imbach et al. | 6,139,483 A | 10/2000 | Seabaugh et al. |
| 5,959,308 A | 9/1999 | Shichijo et al. | 6,140,746 A | 10/2000 | Miyashita et al. |
| 5,959,879 A | 9/1999 | Koo | 6,143,072 A | 11/2000 | McKee et al. |
| 5,962,069 A | 10/1999 | Schindler et al. | 6,143,366 A | 11/2000 | Lu |

| | | | |
|---|---|---|---|
| 6,146,906 A | 11/2000 | Inoue et al. |
| 6,150,239 A | 11/2000 | Goesele et al. |
| 6,151,240 A | 11/2000 | Suzuki |
| 6,153,010 A | 11/2000 | Kiyoku et al. |
| 6,153,454 A | 11/2000 | Krivokapic |
| 6,156,581 A | 12/2000 | Vaudo et al. |
| 6,173,474 B1 | 1/2001 | Conrad |
| 6,174,755 B1 | 1/2001 | Manning |
| 6,175,497 B1 | 1/2001 | Tseng et al. |
| 6,175,555 B1 | 1/2001 | Hoole |
| 6,180,252 B1 | 1/2001 | Farrell et al. |
| 6,180,486 B1 | 1/2001 | Leobandung et al. |
| 6,181,920 B1 | 1/2001 | Dent et al. |
| 6,184,044 B1 | 2/2001 | Sone et al. |
| 6,184,144 B1 | 2/2001 | Lo |
| 6,191,011 B1 | 2/2001 | Gilboa et al. |
| 6,194,753 B1 | 2/2001 | Seon et al. |
| 6,197,503 B1 | 3/2001 | Vo-Dinh et al. |
| 6,198,119 B1 | 3/2001 | Nabatame et al. |
| 6,204,525 B1 | 3/2001 | Sakurai et al. |
| 6,204,737 B1 | 3/2001 | Ella |
| 6,208,453 B1 | 3/2001 | Wessels et al. |
| 6,210,988 B1 | 4/2001 | Howe et al. |
| 6,211,096 B1 | 4/2001 | Allman et al. |
| 6,222,654 B1 | 4/2001 | Frigo |
| 6,224,669 B1 | 5/2001 | Yi et al. |
| 6,225,051 B1 | 5/2001 | Sugiyama et al. |
| 6,229,159 B1 | 5/2001 | Suzuki |
| 6,232,242 B1 | 5/2001 | Hata et al. |
| 6,232,806 B1 | 5/2001 | Woeste et al. |
| 6,232,910 B1 | 5/2001 | Bell et al. |
| 6,233,435 B1 | 5/2001 | Wong |
| 6,235,145 B1 | 5/2001 | Li et al. |
| 6,238,946 B1 | 5/2001 | Ziegler |
| 6,239,012 B1 | 5/2001 | Kinsman |
| 6,239,449 B1 | 5/2001 | Fafard et al. |
| 6,253,649 B1 | 5/2001 | Kawahara et al. |
| 6,241,821 B1 | 6/2001 | Yu et al. |
| 6,242,686 B1 | 6/2001 | Kishimoto et al. |
| 6,248,459 B1 | 6/2001 | Wang et al. |
| 6,248,621 B1 | 6/2001 | Wilk et al. |
| 6,252,261 B1 | 6/2001 | Usui et al. |
| 6,255,198 B1 | 7/2001 | Linthicum et al. |
| 6,256,426 B1 | 7/2001 | Duchet |
| 6,265,749 B1 | 7/2001 | Gardner et al. |
| 6,268,269 B1 | 7/2001 | Lee et al. |
| 6,271,619 B1 | 8/2001 | Yamada et al. |
| 6,275,122 B1 | 8/2001 | Speidell et al. |
| 6,277,436 B1 | 8/2001 | Stauf et al. |
| 6,278,137 B1 | 8/2001 | Shimoyama et al. |
| 6,278,138 B1 | 8/2001 | Suzuki |
| 6,278,523 B1 | 8/2001 | Gorecki |
| 6,278,541 B1 | 8/2001 | Baker |
| 6,291,319 B1 | 9/2001 | Yu et al. |
| 6,291,866 B1 | 9/2001 | Wallace |
| 6,297,598 B1 | 10/2001 | Wang et al. |
| 6,297,842 B1 | 10/2001 | Koizumi et al. |
| 6,300,615 B1 | 10/2001 | Shinohara et al. |
| 6,306,668 B1 | 10/2001 | McKee et al. |
| 6,307,996 B1 | 10/2001 | Nashimoto et al. |
| 6,312,819 B1 | 11/2001 | Jia et al. |
| 6,313,486 B1 | 11/2001 | Kencke et al. |
| 6,316,785 B1 | 11/2001 | Nunoue et al. |
| 6,316,832 B1 | 11/2001 | Tsuzuki et al. |
| 6,319,730 B1 | 11/2001 | Ramdani et al. |
| 6,320,238 B1 | 11/2001 | Kizilyalli et al. |
| 6,326,637 B1 | 12/2001 | Parkin et al. |
| 6,326,645 B1 | 12/2001 | Kadota |
| 6,326,667 B1 | 12/2001 | Sugiyama et al. |
| 6,329,277 B1 | 12/2001 | Liu et al. |
| 6,338,756 B2 | 1/2002 | Dietze |
| 6,339,664 B1 | 1/2002 | Farjady et al. |
| 6,340,788 B1 | 1/2002 | King et al. |
| 6,341,851 B1 | 1/2002 | Takayama et al. |
| 6,343,171 B1 | 1/2002 | Yoshimura et al. |
| 6,345,424 B1 | 2/2002 | Hasegawa et al. |
| 6,348,373 B1 | 2/2002 | Ma et al. |
| 6,355,945 B1 | 3/2002 | Kadota et al. |
| 6,359,330 B1 | 3/2002 | Goudard |
| 6,362,017 B1 | 3/2002 | Manabe et al. |
| 6,362,558 B1 | 3/2002 | Fukui |
| 6,367,699 B2 | 4/2002 | Ackley |
| 6,372,356 B1 | 4/2002 | Thornton et al. |
| 6,372,813 B1 | 4/2002 | Johnson et al. |
| 6,376,337 B1 | 4/2002 | Wang et al. |
| 6,389,209 B1 | 5/2002 | Suhir |
| 6,391,674 B2 | 5/2002 | Ziegler |
| 6,392,253 B1 | 5/2002 | Saxena |
| 6,392,257 B1 | 5/2002 | Ramdani et al. |
| 6,393,167 B1 | 5/2002 | Davis et al. |
| 6,404,027 B1 | 6/2002 | Hong et al. |
| 6,410,941 B1 | 6/2002 | Taylor et al. |
| 6,410,947 B1 | 6/2002 | Wada |
| 6,411,756 B2 | 6/2002 | Sadot et al. |
| 6,415,140 B1 | 7/2002 | Benjamin et al. |
| 6,417,059 B2 | 7/2002 | Huang |
| 6,419,849 B1 | 7/2002 | Qiu et al. |
| 6,427,066 B1 | 7/2002 | Grube |
| 6,432,546 B1 | 8/2002 | Ramesh et al. |
| 6,438,281 B1 | 8/2002 | Tsukamoto et al. |
| 6,445,724 B2 | 9/2002 | Abeles |
| 6,452,232 B1 | 9/2002 | Adan |
| 6,461,927 B1 | 10/2002 | Mochizuki et al. |
| 6,462,360 B1 | 10/2002 | Higgins, Jr. et al. |
| 6,477,285 B1 | 11/2002 | Shanley |
| 6,496,469 B1 | 12/2002 | Uchizaki |
| 6,498,358 B1 | 12/2002 | Lach et al. |
| 6,501,121 B1 | 12/2002 | Yu et al. |
| 6,504,189 B1 | 1/2003 | Matsuda et al. |
| 6,524,651 B2 * | 2/2003 | Gan et al. ................ | 427/255 |
| 6,528,374 B2 | 3/2003 | Bojarczuk, Jr. et al. |
| 6,538,359 B1 | 3/2003 | Hiraku et al. |
| 6,589,887 B1 | 7/2003 | Dalton et al. |
| 2001/0013313 A1 | 8/2001 | Droopad et al. |
| 2001/0020278 A1 | 9/2001 | Saito |
| 2001/0036142 A1 | 11/2001 | Kadowski et al. |
| 2001/0055820 A1 | 12/2001 | Sakurai et al. |
| 2002/0006245 A1 | 1/2002 | Kubota et al. |
| 2002/0008234 A1 | 1/2002 | Emrick |
| 2002/0021855 A1 | 2/2002 | Kim |
| 2002/0030246 A1 | 3/2002 | Eisenbeiser et al. |
| 2002/0047123 A1 | 4/2002 | Ramdani et al. |
| 2002/0047143 A1 | 4/2002 | Ramdani et al. |
| 2002/0052061 A1 | 5/2002 | Fitzgerald |
| 2002/0072245 A1 | 6/2002 | Ooms et al. |
| 2002/0076878 A1 | 6/2002 | Wasa et al. |
| 2002/0079576 A1 | 6/2002 | Seshan |
| 2002/0131675 A1 | 9/2002 | Litvin |
| 2002/0140012 A1 | 10/2002 | Droopad |
| 2002/0145168 A1 | 10/2002 | Bojarczuk, Jr. et al. |
| 2002/0179000 A1 | 12/2002 | Lee et al. |
| 2002/0195610 A1 | 12/2002 | Klosowiak |

FOREIGN PATENT DOCUMENTS

| | | |
|---|---|---|
| DE | 197 12 496 | 10/1997 |
| DE | 198 29 609 | 1/2000 |
| DE | 100 17 137 | 10/2000 |
| EP | 0 247 722 | 12/1987 |
| EP | 0 250 171 | 12/1987 |
| EP | 0 300 499 | 1/1989 |
| EP | 0 309 270 | 3/1989 |
| EP | 0 331 338 | 9/1989 |
| EP | 0 331 467 | 9/1989 |
| EP | 0 342 937 | 11/1989 |
| EP | 0 392 714 | 10/1990 |

| | | | | | |
|---|---|---|---|---|---|
| EP | 0 412 002 | 2/1991 | JP | 01-196809 | 8/1989 |
| EP | 0 455 526 | 6/1991 | JP | 03-149882 | 11/1989 |
| EP | 0 483 993 | 5/1992 | JP | HEI 2-391 | 1/1990 |
| EP | 0 494 514 | 7/1992 | JP | 02051220 | 2/1990 |
| EP | 0 514 018 | 11/1992 | JP | 3-41783 | 2/1991 |
| EP | 0 538 611 | 4/1993 | JP | 03046384 | 2/1991 |
| EP | 0 581 239 | 2/1994 | JP | 3-171617 | 7/1991 |
| EP | 0 600 658 | 6/1994 | JP | 03-188619 | 8/1991 |
| EP | 0 602 568 | 6/1994 | JP | 5-48072 | 2/1993 |
| EP | 0 607 435 | 7/1994 | JP | 5-086477 | 4/1993 |
| EP | 0 614 256 | 9/1994 | JP | 5-152529 | 6/1993 |
| EP | 0 619 283 | 10/1994 | JP | 05150143 | 6/1993 |
| EP | 0 630 057 | 12/1994 | JP | 05 221800 | 8/1993 |
| EP | 0 661 561 | 7/1995 | JP | 5-232307 | 9/1993 |
| EP | 0 860 913 | 8/1995 | JP | 5-238894 | 9/1993 |
| EP | 0 682 266 | 11/1995 | JP | 5-243525 | 9/1993 |
| EP | 0 711 853 | 5/1996 | JP | 5-291299 | 11/1993 |
| EP | 0 766 292 | 4/1997 | JP | 06-069490 | 3/1994 |
| EP | 0 777 379 | 6/1997 | JP | 6-232126 | 8/1994 |
| EP | 0 810 666 | 12/1997 | JP | 6-291299 | 10/1994 |
| EP | 0 828 287 | 3/1998 | JP | 6-334168 | 12/1994 |
| EP | 0 852 416 | 7/1998 | JP | 0812494 | 1/1996 |
| EP | 0 875 922 | 11/1998 | JP | 9-67193 | 3/1997 |
| EP | 0 881 669 | 12/1998 | JP | 9-82913 | 3/1997 |
| EP | 0 884 767 | 12/1998 | JP | 10-256154 | 9/1998 |
| EP | 0 926 739 | 6/1999 | JP | 10-269842 | 10/1998 |
| EP | 0 957 522 | 11/1999 | JP | 10-303396 | 11/1998 |
| EP | 0 964 259 | 12/1999 | JP | 10-321943 | 12/1998 |
| EP | 0 964 453 | 12/1999 | JP | 11135614 | 5/1999 |
| EP | 0 993 027 | 4/2000 | JP | 11-238683 | 8/1999 |
| EP | 0 999 600 | 5/2000 | JP | 11-260835 | 9/1999 |
| EP | 1 001 468 | 5/2000 | JP | 01 294594 | 11/1999 |
| EP | 1 035 759 | 9/2000 | JP | 11340542 | 12/1999 |
| EP | 1 037 272 | 9/2000 | JP | 2000-068466 | 3/2000 |
| EP | 1 043 426 | 10/2000 | JP | 2 000 1645 | 6/2000 |
| EP | 1 043 427 | 10/2000 | JP | 2000-278085 | 10/2000 |
| EP | 1 043 765 | 10/2000 | JP | 2000-349278 | 12/2000 |
| EP | 1 064 442 | 11/2000 | JP | 2000-351692 | 12/2000 |
| EP | 1 069 605 | 1/2001 | JP | 2001-196892 | 7/2001 |
| EP | 1 069 606 | 1/2001 | JP | 2002-9366 | 1/2002 |
| EP | 1 085 319 | 3/2001 | WO | WO 92/10875 | 6/1992 |
| EP | 1 089 338 | 4/2001 | WO | WO 93/07647 | 4/1993 |
| EP | 1 109 212 | 6/2001 | WO | WO 94/03908 | 2/1994 |
| EP | 1 176 230 | 1/2002 | WO | WO 95/02904 | 1/1995 |
| FR | 2 779 843 | 12/1999 | WO | WO 97/45827 | 12/1997 |
| GB | 1 319 311 | 6/1970 | WO | WO 98/05807 | 1/1998 |
| GB | 2 152 315 | 7/1985 | WO | WO 98/20606 | 5/1998 |
| GB | 2 335 792 | 9/1999 | WO | WO 99/14797 | 3/1999 |
| JP | 52-88354 | 7/1977 | WO | WO 99/14804 | 3/1999 |
| JP | 52-89070 | 7/1977 | WO | WO 99/19546 | 4/1999 |
| JP | 52-135684 | 11/1977 | WO | WO 99/63580 | 12/1999 |
| JP | 54-134554 | 10/1979 | WO | WO 99/67882 | 12/1999 |
| JP | 55-87424 | 7/1980 | WO | WO 00/06812 | 2/2000 |
| JP | 58-075868 | 5/1983 | WO | WO 00/16378 | 3/2000 |
| JP | 58-213412 | 12/1983 | WO | WO 00/33363 | 6/2000 |
| JP | 59-044004 | 3/1984 | WO | WO 00/48239 | 8/2000 |
| JP | 59-073498 | 4/1984 | WO | WO 01/04943 A1 | 1/2001 |
| JP | 59066183 | 4/1984 | WO | WO 01/16395 | 3/2001 |
| JP | 60-161635 | 8/1985 | WO | WO 01/33585 | 5/2001 |
| JP | 60-210018 | 10/1985 | WO | WO 01/37330 | 5/2001 |
| JP | 60-212018 | 10/1985 | WO | WO 01/59814 A2 | 8/2001 |
| JP | 61-36981 | 2/1986 | WO | WO 01/59820 A1 | 8/2001 |
| JP | 61-63015 | 4/1986 | WO | WO 01/59821 A1 | 8/2001 |
| JP | 61-108187 | 5/1986 | WO | WO 01/59837 | 8/2001 |
| JP | 62-245205 | 10/1987 | WO | WO 02 01648 | 1/2002 |
| JP | 63-34994 | 2/1988 | WO | WO 02/03113 | 1/2002 |
| JP | 63-131104 | 6/1988 | WO | WO 02/03467 | 1/2002 |
| JP | 63-198365 | 8/1988 | WO | WO 02/03480 | 1/2002 |
| JP | 63-289812 | 11/1988 | WO | WO 02/08806 | 1/2002 |
| JP | 64-50575 | 2/1989 | WO | WO 02/009150 | 1/2002 |
| JP | 64-52329 | 2/1989 | WO | WO 02/09160 A2 | 1/2002 |
| JP | 1-102435 | 4/1989 | WO | WO 02/11254 | 2/2002 |
| JP | 1-179411 | 7/1989 | WO | WO 02/33385 A2 | 4/2002 |

| | | |
|---|---|---|
| WO | WO 02/47127 A2 | 6/2002 |
| WO | WO 02/50879 | 6/2002 |
| WO | WO 02/099885 | 12/2002 |
| WO | WO 03/012874 | 2/2003 |

OTHER PUBLICATIONS

Howley M.E. et al., "Microstructural Study of Colossal Magneto-Resistive Films As A Function Of Growth Temperature, As Deposited and Annealed", 1996, 401, pp. 531-536.*

McKee et al., "BaSi2 and thin film alkaline earth silicides on silicon", Appl. Phys. Lett. 63(20), Nov. 15, 1993, pp. 2818-2820.

McKee et al., "Surface structures and the orthorhombic transformation of thin film BaSi2 on silicon", Mat. Res. Soc. Symp. Proc., vol. 221, 1991.

McKee et al. "Molecular beam epitaxy growth of epitaxial barium silicide, barium oxide, and barium titanate on silicon", Appl. Phys. Lett. 59(7), Aug. 12, 1991, pp. 782-784.

Tambo et al., "Molecular beam epitaxy of SrTiO3 films on Si(100)-2x1 with SrO buffer layer", Jpn. J. Appl. Phys. vol. 37 (1998), pp. 4454-4459.

McKee et al., "Crystalline oxides on silicon: the first five monolayers", Phys. Rev. Lett. 81(4), Oct. 5, 1998, pp. 3014-3017.

Moon et al., "Roles of buffer layers in epitaxial growth of SrTiO3 films on silicon substrates", Jpn. J. Appl. Phys. vol. 33 (1994), pp. 1472-1477.

Yi W. et al; "Mechanism of cleaning Si (100) surface using Sr and SrO for the growth of crystalline SrTiO/sub 2/films" Journal of Vacuum Science & Technology, vol. 20, No. 4, Jul. 2002 pp. 1402-1405.

Xiaming Hu et al; "Sr/Si template formation for the epitaxial growth of SrTiO/sub 3/on silicon" Materials Research Society Proceedings, vol. 716, 2002, pp. 261-266.

Peter Weiss; "Speed demon gets hooked on silicon"; Science News Online; Sep. 15, 2001; pp. 1-3.

"Motorola Develops New Super-Fast Chip"; USA Today; Sep. 4, 2001.

Lori Valigra; "Motorola Lays GaAs on Si Wafer"; AsiaBizTech; Nov. 2001pp. 1-3.

"Holy Grail! Motorola Claims High-Yield GaAs Breakthrough"; Micromagazine.com (no date available); pp. 1-3.

Jong-Gui Yoon; "Growth of Ferroelectric LiNbO3 Thin Film on MgO-Buffered Si by the Sol-Gel Method"; Journal of the Korean Physical Society (Proc. Suppl.); vol. 29, Nov. 1996; pp. S648-S651.

V. Bornand et al.; "Deposition of LiTaO3 thin films by pyrosol process"; Thin Solid Films 304 (1997); pp. 239-244.

R. Droopad et al.; "Development of high dielectric constant epitaxial oxides on silicon by molecular beam epitaxy"; Materials Science and Engineering B87 (2001); pp. 292-296.

A.K. Sharma et al.; "Integration of Pb(Zr0.52Ti0.48)O3 epilayers with Si by domain epitaxy"; Applied Physics Letters, vol. 76, No. 11; Mar. 13, 2000; pp. 1458-1460.

Dwight C. Streit et al; "High Reliability GaAs-AlGaAs HBT's by MBE with Be Base Doping and InGaAs Emitter Contracts"; 8179 Ieee Electron Device Letters: 12(1991) Sep., No. 9, New York, US.

C. Y. Hung et al; "Piezoelectrically induced stress tuning of electro-optic devices"; 320 Applied Physics Letters; 59(1991) Dec. 30, No. 27, New York, US.

J. Piprek; "Heat Flow Analysis of Long-Wvelength VCSELs with Various DBR Materials"; University of Delaware, Materials Science, Newark, DE, 19716-3106; Oct. 31, 1994; pp. 286-287.

P. Mackowiak et al.; "Some aspects of designing an efficient nitride VCSEL resonator"; J. Phys. D; Appl. Phys. 34(2001); pp. 954-958.

M.R. Wilson et al.; GaAs-On-Si: A GaAs IC Manufacturer's Perspective; GaAs IC Symposium, IEEE, 1988; pp. 243-246.

Y. Kitano et al.: "Thin film crystal growth of BaZrO3 at low oxygen partial pressure"; Journal of Crystal Growth 243 (2002); pp. 164-169.

M.E. Hawley: et al.; "Microstructural Study of Colossal Magneto-Resistive Films As a Function of Growth Temperature, As Deposited and Annealed"; 401, 1996; pp. 531-536.

Nakagawara et al., Effects of Buffer Layers in Epitaxial Growth of SrTiO$_3$ Thin Film Si(100), *J. Appl. Phys.*, 78 (12), Dec. 15, 1995, pp. 7226-7230.

Suzuki et al., "A Proposal of Epitaxial Oxide Thin Film Structures For Future Oxide Electronics," *Materials Science and Engineering B41*, (1996), pp. 166-173.

W. F. Egelhoff et al., "Optimizing GMR Spin Valves: The Outlook for Improved Properties", *1998 Int'l Non Volatile Memory Technology Conference*, pp. 34-37.

Wang et al., "Processing and Performance of Piezoelectric Films", Univ. Of MD. Wilcoxon Research Col, and Motorola Labs, May 11, 2000.

M. Rotter et al., "Nonlinear Acoustoelectric Interactions in GaAs/LiNbO$_3$ Structures", *Applied Physics Letters*, vol. 75(7), Aug. 16, 1999, pp. 965-967.

K. Sreenivas et al., "Surface Acoustic Wave Propagation on Lead Zirconate Titanate Thin Films." *Appl. Phys. Lett.* 52 (9), Feb. 29, 1998, pp. 709-711.

M. Rotter et al., "Single Chip Fused Hybrids for Acousto-Electric and Acousto-Optic Applications," *1997 Applied Physics Letters*, vol. 70(16), Apr. 21, 1997, pp. 2097-2099.

A. Mansingh et al., "Surface Acoustic Wave Propagation in PZT/YBCO/SrTiO$_3$ and PbTiO$_3$/YBCO/SrTiO$_3$ Epitaxial Heterostructures," *Ferroelectric*, vol. 224, pp. 275-282, 1999.

S. Mathews et al., "Ferroelectric Field Effect Transistor Based on Epitaxial Perovskite Heterostructures", *Science*, vol. 276, Apr. 11, 1997, pp. 238-240.

R. Houdre et al., "Properties of GaAs on Si Grown by Molecular Beam Epitaxy," *Solid State and Materials Sciences*, vol. 16, Issue 2, 1990, pp. 91-114.

S. F. Fang et al., "Gallium Arsenide and Other Compound Semiconductors on Silicon," *J. Appl. Phys.*, 68(7), Oct. 1, 1990, pp. R31-R58.

Carlin et al., Impact of GaAs Buffer Thickness on Electronic Quality of GaAs Grown on Graded Ge/GeSi/Si Substrates, *Appl. Phys. Letter*, vol. 76, No. 14, Apr. 2000, pp. 1884-1886.

Ringel et al., "Epitaxial Integration of III-V Materials and Devices with Si Using Graded GeSi Buffers," 27th International Symposium on Compound Semiconductors, Oct. 2000.

Zogg et al., "Progress in Compound-Semiconductor-on-Silicon-Heteroepitaxy with Fluoride Buffer Layers," *Electrochem Soc.*, vol. 136, No. 3, Mar. 1998, pp. 775-779.

Xiong et al., "Oxide Defined GaAs Vertical-Cavity Surface-Emitting Lasers on Si Substrates," *IEEE Photonics Technology Letters*, vol. 12, No. 2, Feb. 2000, pp. 110-112.

Clem et al., "Investigation of PZT//LSCO//Pt//Aerogel Thin Film Composites for Uncooled Pyroelectric IR Detectors," *Mat. Res. Soc. Symp. Proc.*, vol. 541, pp. 661-666, 1999.

Gunapala et al., "Bound-To-Quasi-Bound Quantum-Well Infrared Photodectors," NASA Tech Brief, vol. 22, No. 9, Sep. 1998.

Abhay M. Joshi et al., "Monolithic InGaAs-on-silicon Wave Infrared Detector Arrays," *Intn. Society for Optical Engineering*, vol. 2999, pp. 211-224.

Bruley et al., "Nanostructure and Chemistry of a (100)MgO/(100) GaAs Interface," *Appl. Phys Lett*, 65(5), Aug. 1994, pp. 564-566.

Fork et al., "Epitaxial MgO On Si(001) for Y-Ba-Cu-O Thin Film Growth by Pulsed Laser Deposition," *Appl. Phys Lett.*, 58(20), May 20, 1991, pp. 2294-2296.

Himpsel et al., "Dialectrics on Semiconductors," *Materials Science and Engineering*, B1(1988), pp. 9-13.

Li et al., "Epitaxial La$_{0.67}$Sr$_{0.33}$ Magnetic Tunnel Junctions," *J. Appl. Phys.* 81(8), Apr. 15, 1997, pp. 5509-5511.

O'Donnell et al., "Colossal Magnetoresistance Magnetic Tunnel Junctions Grown by Molecular-Beam Epitaxy," *Appl. Physics Letters*, vol. 76, No. 14, Apr. 3, 2000, pp. 1914-1916.

Mikami et al., "Formation of Si Epi/MgO-Al$_2$O$_3$Epi./SiO$_3$/Si and Its Epitaxial Film Quality," Fundamental Research Laboratories and Microelectronics Laboratories, pp. 31-34, 1983.

T. Asano et al., "An Epitaxial Si/Insulator/Si Structure Prepared by Vacuum Deposition of CaF$_2$ and Silicon," *Thin Solid Films*, vol. 93 (1982), pp. 143-150.

T. Chikyow et al., "Reaction and Regrowth Control of $CeO_2$ on Si(111) Surface for the Silicon-On-Insulator Structure," *Appl. Phys. Lett.*, vol. 65, No. 8, Aug. 22, 1994, pp. 1030-1032.

J.F. Kang, et al., "Epitaxial Growth of $CeO_2$(100) Substrates by Dual Ion Beams Reactive Sputtering," *Solid State Communications*, vol. 108, No. 4, pp. 225-227, 1998.

R.A. Morgan et al., "Vertical-Cavity Surface-Emitting Lasers Come of Age," *SPIE*, vol. 2683, pp. 18-29.

"Technical Analysis of Qualcomm QCP-800 Portable Cellular Phone (Transmitter Circuitry)," Talus Corporation, Qualcomm QCP-800 Technical Analysis Report, Dec. 10, 1996, pp. 5-8.

Jo-Ey Wong, et al.; "An Electrostatically-Actuated MEMS Switch for Power Applications"; IEEE, 2000; pp. 633-638.

T. Mizuno, et al.; "Electron and Hole Mobility Enhancement in Strained-Si MOSFET's on SiGe-on-Insulator Substrates Fabricated by SIMOX Technology"; IEEE Electron Device Letters, vol. 21, No. 5, May 2000; pp. 230-232.

F.M. Buffer, et al.; "Strain-dependence of electron transport in bulk Si and deep-submicron MOSFET's" Computatural Electronics, 2000, Book of Abstracts, IWCE Glasgow 2000, 7th Int'l Workshop on, 2000; pp. 64-65.

S.S. Lu, et al.; "Piezoelectric field effect transistor (PEFET) using $In_{0.2}Ga_{0.8}As/Al_{0.35}Ga_{0.65}As/In_{0.2}Ga_{0.8}As/GaAs$ Strained layer structure on (111)B GaAs substrate"; Electronics Letters, 12$^{TH}$ Ma 1994, vol. 30, No. 10; pp. 823-825.

Xihong Kim, et al,"On-Chip Wireless Interconnection with Integrated Antennas"; 2000 IEEE; pp. 20.2.1-20.3.4.

G. Passiopoulos, et al.; "V-Band Single Chip, Direct Carrier BPSK Modulation Transmitter with Integrated Patch Antenna"; 1998 IEEE MTT-S Digest; pp. 305-308.

Mau-Chung Frank Chang, et al.; "RF/Wireless Interconnect for Inter- and Intra-Chip Communications"; Proceedings of the IEEE, vol. 89, No. 4, Apr. 2001; pp. 456-466.

The Electronics Industry Report; Prismark; 2001; pp. 111-120.

J.K. Abrokwah, et al.; "A Manufacturable Complementary GaAs Process"; GaAs IC Symposium, IEEE, 1993; pp. 127-130.

H. Nagata, "A Preliminary Consideration of the Growth Behaviour of $Ce)_2$, $SrTiO_3$ and $SrVO_3$ Films on Si Substrate," *Thin Solid Films*, 224, 1993, pp. 1-3.

Nagata et al., "Heteroepitaxial Growth of $CeO_2$(001) Films on Si(001) Substrates by Pulsed Laser Deposition in Ultrahigh Vacuum," *Jpn. Jour. Appl. Phys.*, vol. 30, No. 68, Jun. 1991, pp. L1136-L1138.

Kado et al., "Heteroepitaxial Growth of SrO Films on Si Substrates," *J. Appl. Phys.*, 61(6), Mar. 15, 1987, pp. 2398-2400.

H. Ishiwara et al., "Epitaxial Growth of Perovskite Type Oxide Films on Substrates"; *Materials Research Symposium Proceedings*, vol. 220, pp. 595-600, Apr. 29-May 3, 1991.

J.K. Abrokwah et al.; "A Manufacturable High-Speed Low-Power Complementary GaAs Process"; Extended Abstracts of the 1994 International Conference on Solid State Devices and Materials, Yokohama, 1994, pp. 592-594.

C.J. Palmstrom et al.; "Stable and Epitaxial Contacts to III-V Compound Semiconductors"; Contacts to Semiconductors Fundamentals and Technology; Noyles Publications, 1993; pp. 67-150.

Jayshri Sabarinathat, et al.; "Submicron three-dimensional Infrared $GaAs/Al_xO_y$-based photonic crystal using single-step epitaxial growth"; Applied Physics Letters, vol. 78, No. 20, May 14, 2001; pp. 3024-3026.

Philip Ball; "The Next Generation of Optical Fibers"; Technology Review, May 2001; pp. 55-61.

John D. Joannopoulos, et al.; "Molding the Flow of Light"; Photonic Crystals; Princeton University Press, 1995.

Thomas F. Krauss, et al.; "Photonic crystals in the optical regime—past, present and future"; Progress in Quantum Electronics 23 (1999) 51-96.

G.H. Jin, et al.; "PLZT Film Waveguide Mach-Zehnder Electrooptic Modulator"; Journal of Lightwave Technology, vol. 18, No. 6, Jun. 2000; pp. 807-812.

D.E. Aspnes, et al.; "Steps on (001) silicon surfaces"; J. Vac. Sci. Technol. B. vol. 5, No. 4, Jul./Aug. 1987; pp. 939-944.

D.M. Newns, et al.; "Mott transition field effect transistor"; Applied Physics Letters, vol. 73, No. 6, Aug. 10, 1998; pp. 780-782.

Lucent Technologies, Inc. "Arrayed Waveguide Grating Multiplexer/Demultiplexer"; Jan. 2000; 4 pages.

Hisashi Shichijo, et al.; "Co-Integration of GaAs MESFET and SI CMOS Circuits"; IEEE Electron Device Letters, vol. 9, No. 9, Sep. 1988; pp. 444-446.

H. Shichijo, et al.; "GaAs MESFET and SI CMOS Cointegration and Circuit Techniques"; 1988 IEEE; GaAs IC Symposium 239-242.

H. Shichijo, et al.; "Monolithic Process for Co-Integration of GaAs and Silicon Circuits"; 1988 IEEE; pp. 778-781.

Z.H. Zhu, et al. "Growth of InGaAs multi-quantum wells at 1.3 m wavelength on GaAs compliant substrates"; Applied Physics Letters, vol. 72, No. 20, May 18, 1998; pp. 2598-2600.

Kurt Eisenbeiser, et al.; "Metamorphic InAlAs/InGaAs Enhancement Mode HEMT's on GaAs Substrates"; IEEE Electron Device Letters, vol. 20, No. 10, Oct. 1999; pp. 507-509.

Tomonori Nagashima, et al.; "Three-Terminal Tandem Solar Cells With a Back-Contact Type Bottom Cell" Higashifuji Technical Center, Toyota Motor Corporation; 4 pages.

James Schellenberg, et al.; "Low-Loss, Planar Monolithic Baluns for K/Ka-Band Applications"; 1999 IEEE MTT-S Digest; pp. 1733-1736.

Arnold Leitner et al; "Pulsed Laser Deposition of Superconducting Strontium Titanate Thin-Films"; ; Session K11-Thin Films and Borocarbides; Mixed Session, Wednesday Afternoon; Mar. 19, 1997; Room 1202 B, Conv. Center (Abstract).

R.D. Vispute; "High quality optoelectronic grade epitaxial AIN films on -$AI_2O_3$, Si and 6H-SiC by pulsed laser deposition"; Thin Solid Films 299 (1997), pp. 94-103.

T. Warren Weeks, et al.; "GaN thin films deposited via organometallic vapor phase epitaxy on (6H)-SiC(0001) using high-temperature monocrystalline AIN buffer layers" 320 Applied Physics Letters, vol. 67, No. 3, Jul. 17, 1995, pp. 401-403.

Z. Yu, et al.; "Epitaxial oxide thin films on SI(001)"; J. Vac. Sci. Technol. B. vol. 18, No. 4, Jul./Aug. 2000; pp. 2139-2145.

Gentex Corporate Website; Photoelectric Smoke Detectors—How They Work; 2001.

Jeffrey B. Casady, et al.; "A Hybrid 6H-SiC Temperature Sensor Operational from 25 C to 500 C"; IEEE Transactions on Components, Packaging, and Manufacturing Technology—Part A, vol. 19, No. 3, Sep. 1996; pp. 416-422.

Ronald W. Waynant, et al.; "Optoelectronic Integrated Circuits"; Electro-Optics Handbook, McGraw-Hill, Inc., 1994; Chapter Twenty Seven.

Antonio Mecozzi, et al.; "The Roles of Semiconductor Optical Amplifiers in Optical Networks"; Optics & Photonics News; Mar. 2001; pp. 37-42.

D.A. Francis, et al.; "A single-chip linear optical amplifier"; OFC, 2001; Mar. 17-22, 2001.

G. Vogg et al.; "Epitaxial alloy films of zintl-phase Ca(Si1-xGex)2"; Journal of Crystal Growth 223 (2001); pp. 573-576.

Peter S. Guilfoyle, et al.; "Optoelectronic Architecture for High-Speed Switching and Processing Applications"; 1998 The Photonics Design and Applications Handbook; pp. H-399-H-406.

Gerald B. Stringfellow; "Organometallic Vapor-Phase Epitaxy: Theory and Practice"; Departments of Materials Science and Engineering and Electrical Engineering, University of Utah; Academic Press, 1989.

M.A. Herman, et al.; "Molecular Beam Epitaxy Fundamentals and Current Status"; Springer-Verlag Berlin Heidelberg, 1989, 1996.

"Integration of GaAs on Si Using a Spinel Buffer Layer", IBM Technical Bulletin, vol. 30, No. 6, Nov. 1987, p. 365.

"GaInAs Superconducting FET," IBM Technical Bulletin, vol. 36, No. 8, Aug. 1993, p. 655-656.

"Epitaxial 3d Structure Using Mixed Spinels," IBM Technical Bulletin, vol. 30, No. 3, Aug. 1987, p. 1271.

Moon et al., "Roles of Buffer Layers in Epitaxial Growth of $SrTiO_3$ Films on Silicon Substrates," *Japan J of Appl. Phys.*, vol. 33, Mar. 1994, pp. 1472-1477.

Yodo et al., GaAs Heteroepitaxial Growth on Si Substrates with Thin Si Interlayers *in situ* Annealed at High Temperatures, *8257b Journal of Vacuum Science & Technology*, May/Jun. 1995, vol. 13, No. 3, pp. 1000-1005.

Cuomo et al., "Substrate Effect on the Superconductivity of $YBa_2Cu_3O_7$ Thin Films," AIP Conference 1988, pp. 141-148.

McKee et al., "Crystalline Oxides on Silicon: The First Five Monolayers," *Physical Review Letters*, vol. 81, No. 14, Oct. 1998, pp. 3014-3017.

McKee et al., "Molecular Beam Epitaxy Growth of Epitaxial Barium Silicide, Barium Oxide, and Barium Titanate on Silicon," *1991 American Institute of Physics*, pp. 782-784, Aug. 13, 1991.

Tambo et al., Molecular Beam Epitaxy Growth of $SrTiO_3$ Films on Si(100)-2x1 with SrO Buffer Layer, *Jpn. J. Appl. Phys.*, vol. 37, 1998, pp. 4454-4459.

McKee et al., "The MBE Growth and Optical Quality of $BaTiO_3$ and $SrTiO_3$ Thin Films on MgO," *Mat. Res. Soc. Symp. Proc.*, vol. 341, Apr. 1994, pp. 309-314.

McKee et al., "$BaSi_2$ and Thin Film Alkaline Earth Silicides on Silicon," *Appl. Phys. Lett.*, 63 (20), Nov. 1993, pp. 2818-2820.

McKee et al., "Surface Structures and the Orthorhombic Transformation of Thin Film $BaSi_2$ on Silicon," *Mat. Res. Soc. Symp. Proc.*, vol. 221, pp. 131-136.

Brian A. Floyd, et al.; "The projected Power Consumption of a Wireless Clock Distribution System and Comparison to Conventional Distribution Systems"; IEEE, 1999; pp. IITC99-249-ITTC99-250.

Mori et al., "Epitaxial Growth of $SrTiO_3$ Films on Si(100) Substrates Using a Focused Electron Beam Evaporation Method," *Jpn. J. of Apl. Phys.*, vol. 30, No. 8A, Aug. 1991, pp. L1415-L1417.

Moon et al., "Growth of Crystalline $SrTiO_3$ Films on Si Substrates Using Thin Fluoride Buffer Layers and Their Electrical Properties," *Jpn. J. of Appl. Phys.*, vol. 33, (1994), pp. 5911-5916.

Farrow et al., "Heteroepitaxy of Dissimilar Materials," *Mat. Res. Soc. Symposium Proceedings*, vol. 221, pp. 29-34, Apr. 29-May 2, 1991.

Ishiwara et al., "Heteroepitaxy on Silicon: Fundamentals, Structure, and Devices," Mat. Res. Soc., Symposium Proceedings, vol. 116, pp. 369-374, Apr. 5-8, 1988.

Douglas B. Chrisey, et al; Pulsed Laser Deposition of Thin Films; pp. 273-285.

B.A. Block, et al; "Photoluminescence properties of $Er^3$-doped $BaTiO_3$ thin films"; Appl. Phys. Lett. 65 (1), Jul. 4, 1994, pp. 25-27.

Kevin J. Chen et al; "A Novel Ultrafast Functional Device: Resonant Tunneling High Electron Mobility Transistor"; Electron Devices Mettingk 1996; IEEE Hong Kong; Jun. 29, 1996; pp. 60-63, XP010210167.

Wenhua Zhu et al; "Molecular Beam Epitaxy of GaAs on Si-on-Insulator"; 320 Applied Physics Letters 59(1991) Jul. 8, No. 2; pp. 210-212.

Umesh K. Mishra et al; "Oxide Based Compound Semiconductor Electronics"; Electron Devices Meeting; 1997; Technical Digest, International; Washington, D.C.; Dec. 7-10, 1997; pp. 545-548.

J.M. Daughton et al.; "Applications of Spin Dependent Transport Materials"; J. Phys. D. Appl. Phys. 32(1999) R169-R177.

Wei Zhang et al.; "Stress Effect and Enhanced Magnetoresistance in $La_{0.67}Ca_{0.33}MnO_{3-\delta}$ Films"; Physical Review, B. Condensed Matter; American Institute of Physics; vol. 58, No. 21, Part 1; Dec. 1, 1998; pp. 14143-14146.

Q.Y. Tong et al.; "IOS-a new type of materials combination for system-on-a chip preparation"; 1999 IEEE International SOI Conference, Oct. 1999; pp. 104-105.

T. Kannianinen et al.; "Growth of Dielectric 1hfo2/Ta205 Thin Film Nanolaminate Capacitors By Atomic Layer Epitaxy"; Electrochemical Society Proceedings, U.S. Electrochemical Society; Pennington, N.J.; Aug. 31, 1997; pp. 36-46.

Myung Bok Lee; "Heteroepitaxial Growth of $BaTio_3$ Films on Si by Pulsed Laser Deposition"; Applied Physics Letters; Mar. 13, 1995; pp. 1331-1333.

Myung Bok Lee; "Formation and Characterization of Eptiaxial $TiO_2$ and $BaTiO_3/TiO_2$ Films on Si Substrate"; Japan Journal Applied Physics Letters; vol. 34; 1995; pp. 808-811.

Gilbert Lecarpentier et al.; "High Accuracy Machine Automated Assembly for Opto Electronics"; 2000 Electronic Components and Technology Conference; pp. 1-4.

R. Ramesh; "Ferroelectric La-Sr-Co-O/Pb-Zr-Ti-O/La-Sr-Co-O Heterostructures on Silicon via Template Growth"; 320 Applied Physics Letters; 63(1993); Dec. 27; No. 26; pp. 3592-3594.

X. Eisenbeiser; "Field Effect Transistors with $SrTiO_3$ Gate Dielectric on Si"; Applied Physics Letters; vol. 76, No. 10; Mar. 6, 2000; pp. 1324-1326.

Stephen A. Mass; "Microwave Mixers"; Second Edition; 2 pp.

Douglas J. Hamilton et al.; "Basic Integrated Circuit Engineering"; pp. 2; 1975.

Takeshi Obata; "Tunneling Magnetoresistance at Up to 270 K in $La_{0.8}Sr_{0.2}MnO_3/SrTiO_3/La_{0.8}Sr_{0.2}MnO_3$ Junctions with 1.6-nm-Thick Barriers"; Applied Physics Letters; vol. 74, No. 2; Jan. 11, 1999; pp. 290-292.

Wei Zhang et al.; "Enhanced Magnetoresistance in La-Ca-Mn-O Films on Si Substrates Using $YbaCuO/CeO_2$ Heterostructures"; Physica C; vol. 282-287, No. 2003; Aug. 1, 1997; pp. 1231-1232.

Shogo Imada et al; "Epitaxial Growth of Ferroelectric $YmnO_3$ Thin Films on Si (111) Substrates by Molecular Beam Epitaxy"; Jpn. J. Appl. Phys. vol. 37 (1998); pp. 6497-6501; Part 1, No. 12A, Dec. 1998.

Ladislav Pust et al.; "Temperature Dependence of the Magnetization Reversal in Co(fcc)-BN-Co(poly hcp) Structures"; Journal of Applied Physics; vol. 85, No. 8; Apr. 1999; pp. 5765-5767.

C. Martinez; "Epitaxial Metallic Nanostructures on GaAs"; Surface Science; vol. 482-485; pp. 910-915; 2001.

Wen-Ching Shih et al.; "Theoretical Investigation of the SAW Properties of Ferroelectric Film Composite Structures"; IEEE Transactions of Ultrasonics, Ferroelectrics, and Frequency Control; vol. 45, No. 2; Mar. 1998; pp. 305-316.

Zhu Dazhong et al.; "Design of $ZnO/SiO_2/Si$ Monolithic Integrated Programmable SAW Filter"; Proceedings of Fifth International Conference on Solid-State and Integrated Circuit Technology; 21-23; Oct. 1998; pp. 826-829.

Kirk-Othmer Encyclopedia of Chemical Technology; Fourth Edition, vol. 12; Fuel Resources to Heat Stabilizers; A Wiley-Interscience Publication; John Wiley & Sons.

Joseph W. Goodman et al; "Optical Interconnections For VLSI Systems"; Proceedings of the IEEE, vol. 72, No. 7 Jul. 1984.

Fathimulla et al.; "Monolithic Integration of InGaAs/InAlAs MODFETs and RTDs on InP-bonded-to Si Substrate"; Fourth International Conference on Indium Phosphide and Related Materials, Newport, RI, USA; Apr. 21-24, 1992 ; pp. 167-170; XP000341253; IEEE, New York, NY, USA; ISBN: 0-7803-0522-1.

H. Takahashi et al.; "Arraryed-Waveguide Grating For Wavelength Division Multi/Demultiplexer With Nanometre REsolution"; Electronics Letters; vol. 26., No. 2, Jan. 18, 1990.

Pierret, R.F.; "1/J-FET and MESFET"; Field Effect Devices; MA, Addison-Wesley; 1990; pp. 9-22.

M. Schreiter, et al.; "Sputtering of Self-Polarized PZT Films for IR-Detector Arrays"; 1998 IEEE; pp. 181-185.

Hideaki Adachi et al.; "Sputtering Preparation of Ferroelectric PLZT Thin Films and Their Optical Applications"; IEEE Transactions of Ultrasonics, Ferroelectrics and Frequency Control, vol. 38, No. 6, Nov. 1991.

A.J. Moulson et al.; "Electroceramics Materials Properties Applications"; Chapman & Hall; pp. 366-369.

P.A. Langjahr et al.; "Epitaxial Growth and Structure of Cubic and Pseudocubic Perovskite Films on Perovskite Substrates"; Mat. Res. Soc. Symp. Proc., Vol. 401; 1995 Materials Research Society; pp. 109-114.

Wang et al.; "Depletion-Mode GaAs MOSFETs with Negligible Drain Current Drift and Hysteresis"; Electron Devices Meeting, 1998, IEDM '98 Technical Digest; pp. 67-70.

Ben G. Streetman; "Solid State Electronic Devices"; 1990, Prentice Hall; Third Edition; pp. 320-322.

A.Y Wu et al.; "Highly Oriented $(Pb,La)(Zr,Ti)O_3$ Thin Films on Amorphous Substrates"; IEEE, 1992; pp. 301-304.

Timothy E. Glassman et al.; "Evidence for Cooperative Oxidation of MoCVD Precursors Used in $Ba_xSr_{1-x}TiO_3$ Film Growth"; Mat. Res. Soc. Symp. Proc. vol. 446, 1997 Materials Research Society; pp. 321-326.

S.N. Subbarao et al.; "Monolithic PIN Photodetector and FET Amplifier on GaAs-os-Si"; IEEE; GaAs IC Symposium-163-166; 1989.

T.A. Langdo et al.; "High Quality Ge on Si by Epitaxial Necking"; Applied Physics Letters; vol. 76, No. 25; pp. 3700-3702; Jun. 19, 2000.

Chenning Hu et al.; Solar Cells From Basics to Advanced Systems; McGraw-Hill Book Company; 1983.

O.J. Painter et al; "Room Temperature Photonic Crystal Defect Lasers at Near-Infrared Wavelengths in InGaAsp"; Journal of Lightwave Technology, vol. 17, No. 11; Nov. 1999.

C. Donn et al.; "A 16-Element, K-Band Monolithic Active Receive Phased Array Antenna"; Antennas and Propagation Society International Symposium, 1988; pp. 188-191, vol. 1; Jun. 6-10, 1988.

Don W. Shaw; "Epitaxial GaAs on Si: Progress and Potential Applications"; Mat. Res. Soc. Symp. Proc.; pp. 15-30; 1987.

G.J.M. Dormans, et al.; "PbTiO$_3$/Thin Films Grown by Organometallic Chemical Vapour Deposition"; Third International Symposium on Integrated Ferroelectrics; Apr. 3-5, 1991 (Abstract).

P.J. Borrelli et al.; "Compositional and Structural Properties of Sputtered PLZT Thin Films"; Ferroelectric Thin Films II Symposium; Dec. 2-4, 1991 (Abstract).

Ranu Nayak et al; "Enhanced acousto-optic diffraction efficiency in a symmetric SrRiO3/BaTiO3/SrTiO3 thin-film heterostructure"; Nov. 1, 2000; vol. 39, No. 31; Applied Optics; pp. 5847-5853.

Ranu Nayak et al; "Studies on acousto-optical interaction in SrTiO3/BaTiO3/SrTiO3 epitaxial thin film heterostructures"; J. Phys. D: Appl. phys. 32 (1999) 380-387.

S.K. Tewksbury et al.; "Cointegration of Optoelectronics and Submicron CMOS"; Wafer Scale Integration; 1993; Proceedings, Fifth Annual IEEE; Jan. 20, 1993; pp. 358-367.

V. Kaushik et al.; "Device Characteristics of Crystalline Epitaxial Oxides on Silicon"; Device Research Conference, 2000; Conference Digest 58th DRC; pp. 17-20; Jun. 19-21, 2000.

Katherine Derbyshire; "Prospects Bright for Optoelectronics Volume, Cost Drive Manufacturing for Optical Applications"; Semiconductor Magazine; vol. 3, No. 3; Mar. 2002.

Alex Chediak et al; "Integration of GaAs/Si with Buffer Layers and Its Impact on Device Integration"; TICS 4, Prof. Sands. MSE 225, Apr. 12, 2002; pp. 1-5.

S.A. Chambers et al; "Band Discontinuities at Epitaxial SrTiO3/SI(001) Heterojunctions"; Applied Physics Letters; vol. 77, No. 11; Sep. 11, 2000; pp. 1662-1664.

H. Wang et al.; "GaAs/GaAlAs Power HBTs for Mobile Communications"; Microwave Symposium Digest; 1993 IEEE; vol. 2.; pp. 549-552.

Y. Ota et al.; "Application of Heterojunction FET to Power Amplifier for Cellular Telephone"; Electronics Letters; May 26, 1994; vol. 30, No. 11; pp. 906-907.

Keiichi Sakuno et al; "A 3.5W HBT MMIC Power Amplifier Module for Mobile Communications"; IEEE 1994; Microwave and Millimeter-Wave Monolithic Circuits Symposium; pp. 63-66.

Mitsubishi Semiconductors Press Release (GaAs FET's) Nov. 8, 1999 pp. 1-2.

R.J. Matyi et al; "Selected Area Heteroepitaxial Growth of GaAs on Silicon for Advanced Device Structures"; 2194 Thin Solid Films; 181 (1989) Dec. 10; No. 1; pp. 213-225.

K. Nashimoto et al; "Patterning of Nb, LaOnZr, TiO3 Waveguides for Fabricating Micro-Optics Using Wet Etching and Solid-Phase Epitaxy"; Applied Physics Letters; vol. 75, No. 8; Aug. 23, 1999; pp. 1054-1056.

Bang-Hung Tsao et al; "Sputtered Barium Titanate and Barium Strontium Titanate Films for Capacitor Applications"; Applications of Ferroelectrics, 2000; Proceedings of the 2000 12th International Symposium on vol. 2; pp. 837-840.

Man Fai Ng et al; "Heteroepitaxial growth of lanthanum aluminate films derived from mixed metal nitrates"; Journal of Materials Research; vol. 12, No. 5; pp. 1306.

Yuji Matsumoto et al.; "Room-Temperature Ferromagnetism in Transparent Transition Metal-Doped Titanium Dioxide"; Science; Feb. 2, 2001; vol. 291; pp. 854-856.

S.A. Chambers et al.; "Epitaxial Growth and Properties of Ferromagnetic Co-Doped TiO2 Anatase"; Applied Physics Letters; vol. 79, No. 21; Nov. 19, 2001; pp. 3467-3469.

Charles Kittel; "Introduction to Solid State Physics"; John Wiley & Sons, Inc. Fifth Edition; pp. 415.

Chyuan-Wei Chen et al; "Liquid-phase epitaxial growth and characterization of InGaAsP layers grown on GaAsP substrates for application to orange light-emitting diodes"; 931 Journal of Applied Physics; 77 (1995) Jan. 15, No. 2; Woodbury, NY, US; pp. 905-909.

W. Zhu et al. ; "Oriented diamond films grown on nickel substrates"; 320 Applied Physics Letters; 63(1993) Sep., No. 12, Woodbury, NY, US; pp. 1640-1642.

M. Schreck et al. ; "Diamond/Ir/SrRTiO3; A material combination for improved heteroepitaxial diamond films"; Applied Physics Letters; vol. 74, No. 6; Feb. 1, 1999; pp. 650-652.

Yoshihiro Yokota et al.; "Cathodoluminescence of boron-doped heteroepitaxial diamond films on platinum"; Diamond and Related Materials 8(1999) ; pp. 1587-1591.

J. R. Busch et al.; "Linear Electro-Optic Response in Sol-Gel PZT Planar Waveguide"; Electronics Letters; Aug. 13, 1992; vol. 28, No. 17; pp. 1591-1592.

R. Droopad et al: "Epitaxial Oxide Films on Silicon: Growth, Modeling and Device Properties"; Mat. Res. Soc. Symp. Proc. vol. 619; 2000 Materials Research Society; pp. 155-166.

H. Ohkubo et al.; "Fabrication of High Quality Perovskite Oxide Films by Lateral Epitaxy Verified with RHEED Oscillation"; 2419A Int. Conf. on Solid State Devices & Materials, Taukuba, Aug. 26-28 (1992) ; pp. 457-459.

Lin Li: "Ferroelectric/Superconductor Heterostructures"; Materials Science and Engineering; 29 (2000) pp. 153-181.

L. Fan et al. ; "Dynaamic Beam Switching of Vertical-Cavity Surface-Emitting Lasers with Integrated Optical Beam Routers"; IEEE Photonics Technology Letters; vol. 9, No. 4; Arp. 4, 1997; pp. 505-507.

Y. Q. Xu. et al. ; "(Mn, Sb) dropped-Pb(Zr, Ti)03 infrared detector arrays"; Journal of Applied Physics; vol. 88, No. 2; Jul. 15, 2000; pp. 1004-1007.

Kiyoko Kato et al. ; "Reduction of dislocations in InGaAs layer on GaAs using epitaxial lateral overgrowth"; 2300 Journal of Crystal Growth 115 (1991) pp. 174-179; Dec. 1991.

\* cited by examiner

US 7,169,619 B2

METHOD FOR FABRICATING SEMICONDUCTOR STRUCTURES ON VICINAL SUBSTRATES USING A LOW TEMPERATURE, LOW PRESSURE, ALKALINE EARTH METAL-RICH PROCESS

FIELD OF THE INVENTION

This invention relates generally to a method for fabricating semiconductor structures and devices and more specifically to a method for fabricating semiconductor structures and devices on vicinal substrates using a low temperature, low pressure, alkaline earth metal-rich process.

BACKGROUND OF THE INVENTION

Semiconductor devices often include multiple layers of conductive, insulating, and semiconductive layers. Often, the desirable properties of such layers improve with the crystallinity of the layer. For example, the electron mobility and electron lifetime of semiconductive layers improve as the crystallinity of the layer increases. Similarly, the free electron concentration of conductive layers and the electron charge displacement and electron energy recoverability of insulative or dielectric films improve as the crystallinity of these layers increases.

For many years, attempts have been made to grow various monolithic thin films on a foreign substrate such as silicon (Si). To achieve optimal characteristics of the various monolithic layers, however, a monocrystalline film of high crystalline quality is desired. Attempts have been made, for example, to grow various monocrystalline layers on a substrate such as germanium, silicon, and various insulators. These attempts have generally been unsuccessful because lattice mismatches between the host crystal and the grown crystal have caused the resulting layer of monocrystalline material to be of low crystalline quality.

If a large area thin film of high quality monocrystalline material were available at low cost, a variety of semiconductor devices could advantageously be fabricated in or using that film at a low cost compared to the cost of fabricating such devices beginning with a bulk wafer of semiconductor material or in an epitaxial film of such material on a bulk wafer of semiconductor material. In addition, if a thin film of high quality monocrystalline material could be realized beginning with a bulk wafer such as a silicon wafer, an integrated device structure could be achieved that took advantage of the best properties of both the silicon and the high quality monocrystalline material.

Epitaxial growth of monocrystalline oxide thin films on silicon has numerous potential device applications, such as, for example, ferroelectric devices, high density memory devices, and next-generation MOS devices. Some of these oxides, such as BaO and $BaTiO_3$, were formed on silicon (100) using a $BaSi_2$ (cubic) template by depositing one fourth monolayer of Ba on silicon (100) using molecular beam epitaxy at temperatures greater than 850° C. See, e.g., R. McKee et al., Appl. Phys. Lett. 59(7), p. 782–784 (12 Aug. 1991); R. McKee et al., Appl. Phys. Lett. 63(20), p. 2818–2820 (15 Nov. 1993); R. McKee et al., Mat. Res. Soc. Symp. Proc., Vol. 21, p. 131–135 (1991); U.S. Pat. No. 5,225,031, issued Jul. 6, 1993, entitled "PROCESS FOR DEPOSITING AN OXIDE EPITAXIALLY ONTO A SILICON SUBSTRATE AND STRUCTURES PREPARED WITH THE PROCESS"; and U.S. Pat. No. 5,482,003, issued Jan. 9, 1996, entitled "PROCESS FOR DEPOSITING EPITAXIAL ALKALINE EARTH OXIDE ONTO A SUBSTRATE AND STRUCTURES PREPARED WITH THE PROCESS." A strontium silicide ($SrSi_2$) interface model with a c(4×2) structure was proposed. See, e.g., R. McKee et al., Phys. Rev. Lett. 81(14), 3014 (5 Oct. 1998).

Growth of $SrTiO_3$ on silicon (100) using an SrO buffer layer has been accomplished. See, e.g., T. Tambo et al., Jpn. J. Appl. Phys., Vol. 37, p. 4454–4459 (1998). However, the SrO buffer layer was thick (100 Å), and crystallinity was not maintained throughout the growth. Furthermore, $SrTiO_3$ has been grown on silicon using thick oxide layers (60–120 Å) of SrO or TiO. See, e.g., B. K. Moon et al., Jpn. J. Appl. Phys., Vol. 33, p. 1472–1477 (1994). These thick buffer layers, however, would limit the application for transistors.

Accordingly, a need exists for a semiconductor structure that provides a high quality monocrystalline film or layer over another monocrystalline material and for a process for making such a structure.

BRIEF DESCRIPTION OF THE DRAWINGS

The present invention is illustrated by way of example and not limitation in the accompanying figures, in which like references indicate similar elements, and in which.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

Figure 1:
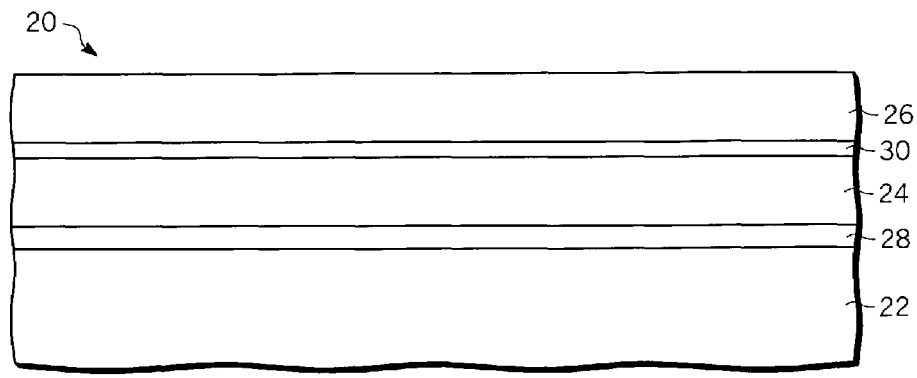
FIGS. 1, 2, and 3 illustrate schematically, in cross section, device structures in accordance with various embodiments of the invention.

FIG. 1 illustrates schematically, in cross section, a portion of a semiconductor structure 20 in accordance with an embodiment of the invention. Semiconductor structure 20 includes a monocrystalline substrate 22, accommodating buffer layer 24 comprising a monocrystalline material, and may include an additional monocrystalline material layer 26. In this context, the term "monocrystalline" shall have the meaning commonly used within the semiconductor industry. The term shall refer to materials that are a single crystal or that are substantially a single crystal and shall include those materials having a relatively small number of defects such as dislocations and the like as are commonly found in substrates of silicon or germanium or mixtures of silicon and germanium and epitaxial layers of such materials commonly found in the semiconductor industry.

In accordance with one embodiment of the invention, structure 20 also includes an amorphous interface layer 28 positioned between substrate 22 and accommodating buffer layer 24. Structure 20 may also include a template layer 30 between the accommodating buffer layer and monocrystalline material layer 26. When present, the template layer helps to initiate the growth of the monocrystalline material layer on the accommodating buffer layer. The amorphous interface layer helps to decouple the buffer layer from the substrate.

Substrate 22, in accordance with an embodiment of the invention, is a monocrystalline semiconductor or compound semiconductor wafer, preferably of large diameter. The wafer can be of, for example, a material from Group IV of the periodic table. Examples of Group IV semiconductor materials include silicon, germanium, mixed silicon and germanium, mixed silicon and carbon, mixed silicon, germanium and carbon, and the like. Preferably substrate 22 is a wafer containing silicon or germanium, and most preferably is a high quality monocrystalline silicon wafer as used in the semiconductor industry. Accommodating buffer layer 24 is preferably a monocrystalline oxide or nitride material epitaxially grown on the underlying substrate. In accordance with one embodiment of the invention, amorphous interface layer 28 is grown on substrate 22 at the interface between substrate 22 and the growing accommodating buffer layer by the oxidation of substrate 22 either during or after the growth of layer 24. The amorphous interface layer 28 serves as a decoupling layer between the substrate and the buffer layer. As used herein, lattice constant refers to the distance between atoms of a cell measured in the plane of the surface.

Accommodating buffer layer 24 is preferably a monocrystalline oxide or nitride material selected for its crystalline compatibility with the underlying substrate and with any overlying material layer. For example, the material could be an oxide or nitride having a lattice structure closely matched to the substrate and to the subsequently applied monocrystalline material layer. Materials that are suitable for the accommodating buffer layer include metal oxides such as the alkaline earth metal titanates, alkaline earth metal zirconates, alkaline earth metal hafnates, alkaline earth metal tantalates, alkaline earth metal ruthenates, alkaline earth metal niobates, alkaline earth metal vanadates, alkaline earth metal tin-based perovskites, lanthanum aluminate, lanthanum scandium oxide, and other perovskite oxide materials, and gadolinium oxide. Additionally, various nitrides such as gallium nitride, aluminum nitride, and boron nitride may also be used for the accommodating buffer layer. Most of these materials are insulators, although strontium ruthenate, for example, is a conductor. Generally, these materials are metal oxides or metal nitrides, and more particularly, these metal oxides or nitrides typically include at least two different metallic elements. In some specific applications, the metal oxides or nitrides may include three or more different metallic elements.

Amorphous interface layer 28 is preferably an oxide formed by the oxidation of the surface of substrate 22, and more preferably is composed of a silicon oxide, silicate or the combination of the two. The thickness of layer 28 is sufficient to decouple the substrate 22 from the buffer layer 24. Because if its desirable chemically stability, low dielectric constant, and amorphous phase, the amorphous interfacial layer serves to decouple the buffer layer from the substrate crystal-graphically, chemically, and dielectrically.

When structure 20 includes a monocrystalline layer 26, the material for monocrystalline material layer 26 can be selected, as desired, for a particular structure or application. For example, the monocrystalline material of layer 26 may comprise a another monocrystalline oxide or nitride layer. Monocrystalline material layer 26 may also comprise other semiconductor materials, metals, or non-metal materials which are used in the formation of semiconductor structures, devices and/or integrated circuits.

Suitable template materials chemically bond to the surface of the accommodating buffer layer 24 at selected sites and provide sites for the nucleation of the epitaxial growth of monocrystalline material layer 26. When used, template layer 30 has a thickness ranging from about 1 to about 10 monolayers.

Figure 2:
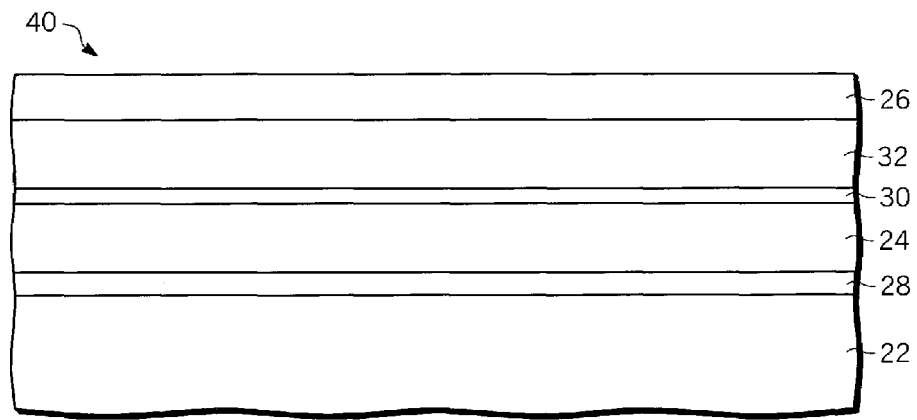

FIG. 2 illustrates, in cross section, a portion of a semiconductor structure 40 in accordance with a further embodiment of the invention. Structure 40 is similar to the previously described semiconductor structure 20, except that an additional buffer layer 32 is positioned between accommodating buffer layer 24 and monocrystalline material layer 26. Specifically, the additional buffer layer 32 is positioned between template layer 30 and the overlying monocrystalline material layer 26. The additional buffer layer serves to provide a lattice compensation when the lattice constant of the accommodating buffer layer cannot be adequately matched to the overlying monocrystalline material layer 26.

Figure 3:
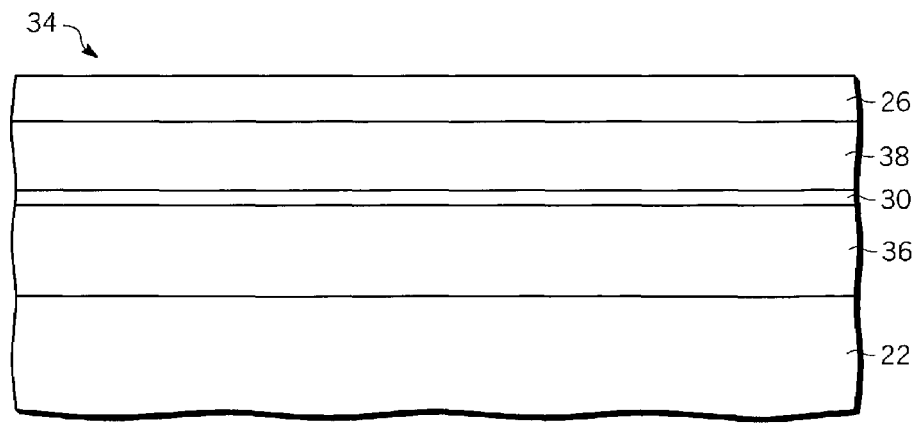

FIG. 3 schematically illustrates, in cross section, a portion of a semiconductor structure 34 in accordance with another exemplary embodiment of the invention. Structure 34 is similar to structure 20, except that structure 34 includes an amorphous layer 36, rather than accommodating buffer layer 24 and amorphous interface layer 28, and an additional monocrystalline layer 38.

As explained in greater detail below, amorphous layer 36 may be formed by first forming an accommodating buffer layer and an amorphous interface layer in a similar manner to that described above. Monocrystalline layer 38 is then formed (by epitaxial growth) overlying the monocrystalline accommodating buffer layer. The accommodating buffer layer may then be optionally exposed to an anneal process to convert at least a portion of the monocrystalline accommodating buffer layer to an amorphous layer. Amorphous layer 36 formed in this manner comprises materials from both the accommodating buffer and interface layers, which amorphous layers may or may not amalgamate. Thus, layer 36 may comprise one or two amorphous layers. The processes previously described above in connection with FIGS. 1 and 2 are adequate for growing monocrystalline material layers over a monocrystalline substrate. However, the process described in connection with FIG. 3, which includes transforming at least a portion of a monocrystalline accommodating buffer layer to an amorphous oxide layer. Additional monocrystalline layer 38 may include any of the materials described throughout this application in connection with either of monocrystalline material layer 26 or additional buffer layer 32.

In accordance with one embodiment of the present invention, additional monocrystalline layer 38 serves as an anneal cap during layer 36 formation and as a template for subsequent monocrystalline layer 26 formation. Accordingly, layer 38 is preferably thick enough to provide a suitable template for layer 26 growth (at least one monolayer) and thin enough to allow layer 38 to form as a substantially defect free monocrystalline material.

In accordance with another embodiment of the invention, additional monocrystalline layer 38 comprises monocrystalline material (e.g., a material discussed above in connection with monocrystalline layer 26) and does not include monocrystalline material layer 26. In other words, the semiconductor structure in accordance with this embodiment only includes one monocrystalline layer disposed above amorphous oxide layer 36.

The following non-limiting, illustrative examples illustrate various combinations of materials useful in structures 20, 40, and 34 in accordance with various alternative embodiments of the invention. These examples are merely illustrative, and it is not intended that the invention be limited to these illustrative examples.

EXAMPLE 1

In accordance with one embodiment of the invention, monocrystalline substrate 22 is a silicon substrate typically (001) oriented. The silicon substrate can be, for example, a silicon substrate as is commonly used in making complementary metal oxide semiconductor (CMOS) integrated circuits having a diameter of about 200–300 mm. In accordance with this embodiment of the invention, accommodating buffer layer 24 is a monocrystalline layer of $Sr_zBa_{1-z}TiO_3$ where z ranges from 0 to 1 and the amorphous intermediate layer is a layer of silicon oxide ($SiO_x$) formed at the interface between the silicon substrate and the accommodating buffer layer. The value of z is selected to obtain one or more lattice constants closely matched to corresponding lattice constants of the substrate and any subsequently formed layer 26. The lattice structure of the resulting crystalline oxide exhibits a substantially 45° rotation with respect to the substrate silicon lattice structure. The accommodating buffer layer can have a thickness of about 2 to about 200 nanometers (nm). In general, it is desired to have an accommodating buffer layer thick enough to isolate the monocrystalline material layer 26 from the substrate to obtain the desired electrical and optical properties. Layers thicker than 200 nm usually provide little additional benefit while increasing cost unnecessarily; however, thicker layers may be fabricated if needed. The amorphous interface layer 28 of silicon oxide can have a thickness of about 0.5–500 nm.

EXAMPLE 2

This example provides exemplary materials useful in structure 34, as illustrated in FIG. 3. Substrate material 22, template layer 30, and monocrystalline material layer 26 may be the same as those described above in connection with example 1.

Amorphous layer 36 is an amorphous oxide layer which is suitably formed of a combination of amorphous interface layer materials (e.g., layer 28 materials as described above) and accommodating buffer layer materials (e.g., layer 24 materials as described above). For example, amorphous layer 36 may include a combination of $SiO_x$ and $Sr_zBa_{1-z}TiO_3$ (where z ranges from 0 to 1), which combine or mix, at least partially, during an anneal process to form amorphous oxide layer 36.

The thickness of amorphous layer 36 may vary from application to application and may depend on such factors as desired insulating properties of layer 36, type of monocrystalline material comprising layer 26, and the like. In accordance with one exemplary aspect of the present embodiment, layer 36 thickness is about 1 nm to about 500 nm.

Layer 38 comprises a monocrystalline material that can be grown epitaxially over a monocrystalline oxide material such as material used to form accommodating buffer layer 24. In accordance with one embodiment of the invention, layer 38 includes the same materials as those comprising layer 26. However, in accordance with other embodiments of the present invention, layer 38 may include materials different from those used to form layer 26. In accordance with one exemplary embodiment of the invention, layer 38 is about 1 nm to about 500 nm thick.

Referring again to FIGS. 1–3, substrate 22 is a monocrystalline substrate such as a monocrystalline silicon or gallium arsenide substrate. The crystalline structure of the monocrystalline substrate is characterized by a lattice constant and by a lattice orientation. In similar manner, accommodating buffer layer 24 is also a monocrystalline material and the lattice of that monocrystalline material is characterized by a lattice constant and a crystal orientation. The lattice constants of the accommodating buffer layer and the monocrystalline substrate must be closely matched or, alternatively, must be such that upon rotation of one crystal orientation with respect to the other crystal orientation, a substantial match in lattice constants is achieved. In this context the terms "substantially equal" and "substantially matched" mean that there is sufficient similarity between the lattice constants to permit the growth of a high quality crystalline layer on the underlying layer.

Figure 4:
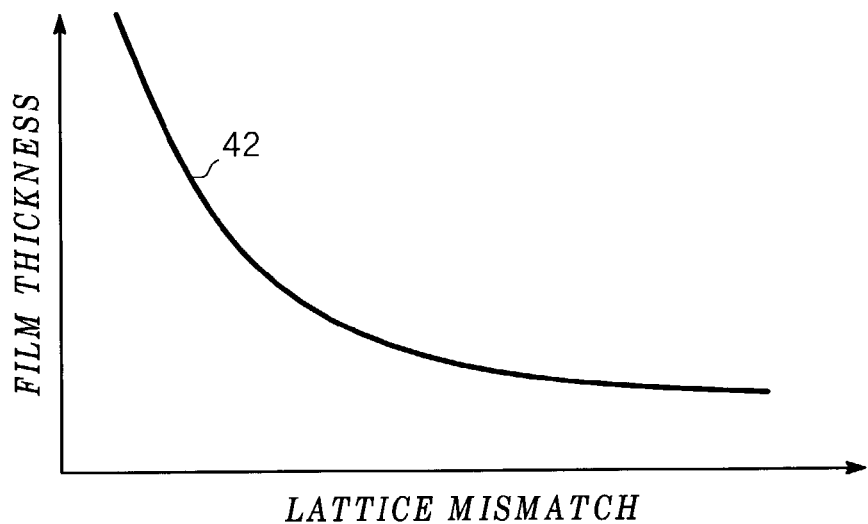
FIG. 4 illustrates graphically the relationship between maximum attainable film thickness and lattice mismatch between a host crystal and a grown crystalline overlayer.

FIG. 4 illustrates graphically the relationship of the achievable thickness of a grown crystal layer of high crystalline quality as a function of the mismatch between the lattice constants of the host crystal and the grown crystal. Curve 42 illustrates the boundary of high crystalline quality material. The area to the right of curve 42 represents layers that have a large number of defects. With no lattice mismatch, it is theoretically possible to grow an infinitely thick, high quality epitaxial layer on the host crystal. As the mismatch in lattice constants increases, the thickness of achievable, high quality crystalline layer decreases rapidly.

In accordance with one embodiment of the invention, substrate 22 is typically a (001) oriented monocrystalline silicon wafer and accommodating buffer layer 24 is a layer of strontium barium titanate. Substantial (i.e., effective) matching of lattice constants between these two materials is achieved by rotating the crystal orientation of the titanate material by approximately 45° with respect to the crystal orientation of the silicon substrate wafer. The inclusion in the structure of amorphous interface layer 28, a silicon oxide layer in this example, if it is of sufficient thickness, serves to reduce strain in the titanate monocrystalline layer that might result from any mismatch in the lattice constants of the host silicon wafer and the grown titanate layer. As a result, in accordance with an embodiment of the invention, a high quality, thick, monocrystalline titanate layer is achievable.

Still referring to FIGS. 1–3, layer 26 is a layer of epitaxially grown monocrystalline material and that crystalline material is also characterized by a crystal lattice constant and a crystal orientation. In accordance with one embodiment of the invention, the lattice constant of layer 26 differs from the lattice constant of substrate 22. To achieve high crystalline quality in this epitaxially grown monocrystalline layer, the accommodating buffer layer 24 must be of high crystalline quality. In addition, in order to achieve high crystalline quality in layer 26, substantial matching between the crystal lattice constant of the host crystal, in this case, the monocrystalline accommodating buffer layer, and the grown crystal is desired. With properly selected materials this substantial matching of lattice constants is achieved as a result of rotation of the crystal orientation of the grown crystal with respect to the orientation of the host crystal. In some instances, a crystalline buffer layer 32 between the host oxide and the grown monocrystalline material layer 26 can be used to reduce strain in the grown monocrystalline material layer that might result from small differences in lattice constants. Better crystalline quality in the grown monocrystalline material layer can thereby be achieved.

The following example illustrates a process, in accordance with one embodiment of the invention, for fabricating a semiconductor structure such as the structures depicted in FIGS. 1–3. The process starts by providing a monocrystalline semiconductor substrate comprising silicon or germanium. In accordance with a preferred embodiment of the invention, the semiconductor substrate is a silicon wafer having a (100) orientation. The substrate is oriented on axis or, at most, about 6° off axis, and preferably misoriented 1–3° off axis toward the [110] direction. At least a portion of the semiconductor substrate has a bare surface, although other portions of the substrate, as described below, may encompass other structures. The term "bare" in this context means that the surface in the portion of the substrate has been cleaned to remove any oxides, contaminants, or other foreign material. As is well known, bare silicon is highly reactive and readily forms a native oxide. The term "bare" is intended to encompass such a native oxide. A thin silicon oxide may also be intentionally grown on the semiconductor substrate, although such a grown oxide is not essential to the process in accordance with the invention. In order to epitaxially grow a monocrystalline oxide layer overlying the monocrystalline substrate, the native oxide layer must first be removed to expose the crystalline structure of the underlying substrate. The following process is preferably carried out by molecular beam epitaxy (MBE), although other epitaxial processes may also be used in accordance with the present invention. The native oxide can be removed by first thermally depositing a thin layer (preferably 1–3 monolayers) of strontium, barium, a combination of strontium and barium, or other alkaline earth metals or combinations of alkaline earth metals in an MBE apparatus. In the case where strontium is used, the substrate is then heated to a temperature above 720° C. as measured by an optical pyrometer to cause the strontium to react with the native silicon oxide layer. The strontium serves to reduce the silicon oxide to leave a silicon oxide-free surface. The resultant surface may exhibit an ordered (2×1) structure. If an ordered (2×1) structure has not been achieved at this stage of the process, the structure may be exposed to additional strontium until an ordered (2×1) structure is obtained. The ordered (2×1) structure forms a template for the ordered growth of an overlying layer of a monocrystalline oxide. The template provides the necessary chemical and physical properties to nucleate the crystalline growth of an overlying layer.

It is understood that precise measurement of actual temperatures in MBE equipment, as well as other processing equipment, is difficult, and is commonly accomplished by the use of a pyrometer or by means of a thermocouple placed in close proximity to the substrate. Calibrations can be performed to correlate the pyrometer temperature reading to that of the thermocouple. However, neither temperature reading is necessarily a precise indication of actual substrate temperature. Furthermore, variations may exist when measuring temperatures from one MBE system to another MBE system. For the purpose of this description, typical pyrometer temperatures will be used, and it should be understood that variations may exist in practice due to these measurement difficulties.

In accordance with an alternate embodiment of the invention, the native silicon oxide can be converted and the substrate surface can be prepared for the growth of a monocrystalline oxide layer by depositing an alkaline earth metal oxide, such as strontium oxide, strontium barium oxide, or barium oxide, onto the substrate surface by MBE at a low temperature and by subsequently heating the structure to a temperature of above 720° C. At this temperature a solid state reaction takes place between the strontium oxide and the native silicon oxide causing the reduction of the native silicon oxide and leaving an ordered (2×1) structure on the substrate surface. If an ordered (2×1) structure has not been achieved at this stage of the process, the structure may be exposed to additional strontium until an ordered (2×1) structure is obtained. Again, this forms a template for the subsequent growth of an ordered monocrystalline oxide layer.

Following the removal of the silicon oxide from the surface of the substrate, in accordance with one embodiment of the invention, the substrate is cooled to a temperature in the range of about 200–600° C., preferably 350°–550° C., and a layer of strontium titanate is grown on the template layer by molecular beam epitaxy. The MBE process is initiated by opening shutters in the MBE apparatus to expose strontium, titanium and oxygen sources. The partial pressure of oxygen is initially set at a minimum value to grow stoichiometric strontium titanate at a growth rate of about 0.1–0.8 nm per minute, preferably 0.3–0.5 nm per minute. After initiating growth of the strontium titanate, the partial pressure of oxygen is increased above the initial minimum value. The stoichiometry of the film can be controlled during growth by monitoring RHEED patterns and adjusting the titanium and strontium fluxes. The overpressure of oxygen causes the growth of an amorphous silicon oxide layer at the interface between the underlying substrate and the strontium titanate layer. This step may be applied either during or after the growth of the strontium titanate layer. The growth of the amorphous silicon oxide layer results from the diffusion of oxygen through the strontium titanate layer to the interface where the oxygen reacts with silicon at the surface of the underlying substrate. The strontium titanate grows as an ordered (100) monocrystal with the (100) crystalline orientation rotated by 45° with respect to the underlying substrate.

The structure illustrated in FIG. 2 can be formed by the process discussed above with the addition of an additional buffer layer deposition step. The additional buffer layer 32 is formed overlying the template layer 30 before the deposition of the monocrystalline material layer 26.

Structure 34, illustrated in FIG. 3, may be formed by growing an accommodating buffer layer 24, forming an amorphous oxide layer 18 over substrate 22, and growing layer 38 over the accommodating buffer layer, as described above. The accommodating buffer layer 24 and the amorphous oxide layer 28 are then exposed to a higher temperature anneal process sufficient to change the crystalline structure of the accommodating buffer layer from monocrystalline to amorphous, thereby forming an amorphous layer such that the combination of the amorphous oxide layer and the now amorphous accommodating buffer layer form a single amorphous oxide layer 36. Layer 26 is then subsequently grown over layer 38. Alternatively, the anneal process may be carried out subsequent to growth of layer 26.

In accordance with one aspect of this embodiment, layer 36 is formed by exposing substrate 22, the accommodating buffer layer 24, the amorphous oxide layer 28, and monocrystalline layer 38 to a rapid thermal anneal process with a peak temperature of about 700° C. to about 1000° C. (actual temperature) and a process time of about 5 seconds to about 20 minutes. However, other suitable anneal processes may be employed to convert the accommodating buffer layer to an amorphous layer in accordance with the present invention. For example, laser annealing, electron beam annealing, or "conventional" thermal annealing processes (in the proper environment) may be used to form layer 36. When conventional thermal annealing is employed to form layer 36, an overpressure of one or more constituents of layer 38 may be required to prevent degradation of layer 38 during the anneal process. Alternately, an appropriate anneal cap, such as silicon nitride, may be utilized to prevent the degradation of layer 38 during the anneal process with the anneal cap being removed after the annealing process.

As noted above, layer 38 of structure 34 may include any materials suitable for either of layers 32 or 26. Accordingly, any deposition or growth methods described in connection with either layer 32 or 26 may be employed to deposit layer 38.

Figure 5:
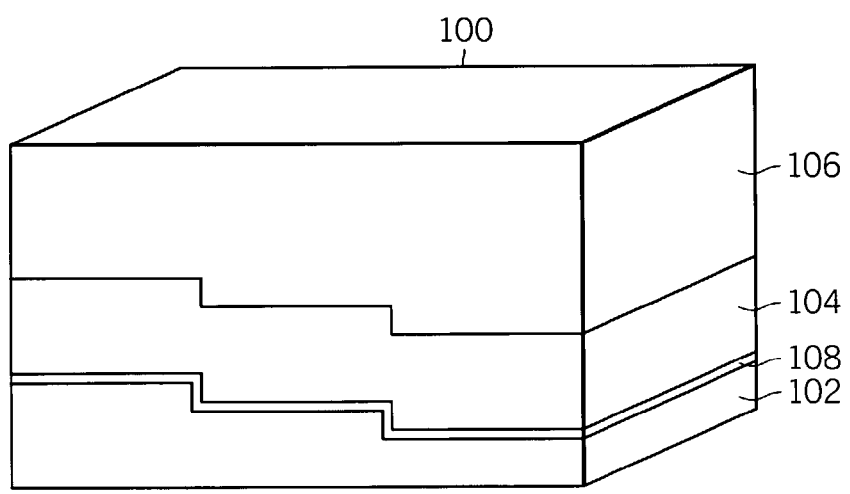
FIG. 5 illustrates schematically, in cross-section, a device structure in accordance with an exemplary embodiment of the invention.

In accordance with another exemplary embodiment of the invention, high quality epitaxial metal oxide layers, such as accommodating buffer layer 24 illustrated in FIGS. 1 and 2, that comprise at least two metals in the general formula $ABO_3$, may be grown on vicinal substrates using an alkaline earth metal-rich, low temperature, low pressure process. FIG. 5 illustrates a semiconductor structure 100, similar to semiconductor structure 20 of FIG. 1, but showing in greater detail a substrate 102 having a vicinal surface. Semiconductor structure 100 also has an metal oxide layer (or accommodating buffer layer) 104, an optional monocrystalline material layer 106, and an amorphous interface layer 108. In some cases, a vicinal surface may arise as a result of preparing substrate 102. In other cases, substrate 102 may be intentionally off-cut in an effort to reduce the number of anti-phase domains in material layer 106. It is well-known that the vicinal surface has a higher density of steps and defects than the on-axis surface. While vicinal substrates may be desirable for material layer 106 growth in some cases, vicinal surfaces of monocrystalline substrates pose particular challenges to the epitaxial growth of metal oxide layers, as steps and defects on vicinal surfaces are highly reactive with oxygen. Oxidation may occur at the step edges and defects of vicinal surfaces, resulting in formation of local disordered substrate-oxide phases. In addition, columnar growth of the metal oxide may result on vicinal substrates. However, using the various embodiments of the process of the present invention, epitaxial two-dimensional growth of the metal oxide layer can be achieved.

The process in accordance with various embodiments of the present invention may be illustrated according to the following example. In this example, metal oxide layer 104 has at least one alkaline earth metal A and at least one metal B and can be represented by the general formula $ABO_3$, although it will be appreciated that the process is not intended to be limited to this particular material.

Figure 6:
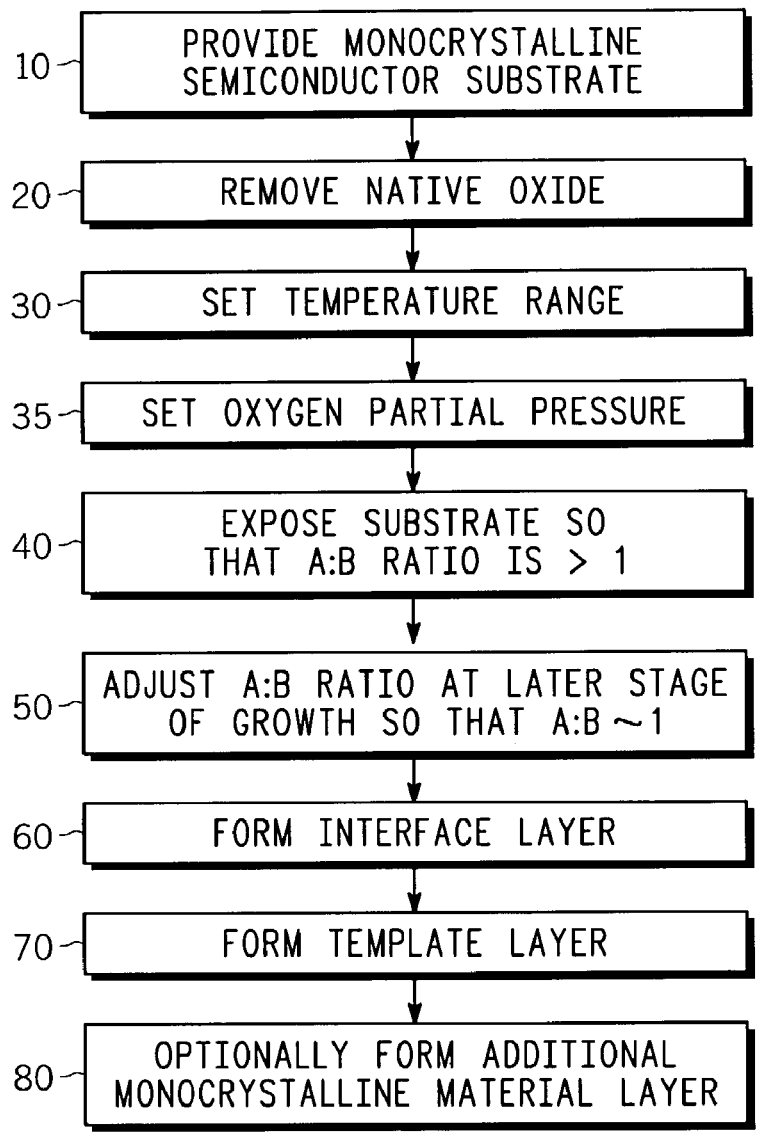
FIG. 6 illustrates a process for producing device structures in accordance with various embodiments of the invention.

Referring to FIG. 6, the process starts by providing a monocrystalline semiconductor substrate comprising silicon or germanium (10). In accordance with a preferred embodiment of the invention, the semiconductor substrate is a silicon wafer having a (100) orientation. As described above, the monocrystalline semiconductor substrate can be a vicinal substrate. The substrate is oriented on axis or, at most, about 6° off axis, and preferably is misoriented 1–3° off axis toward the [110] direction. The process previously described for removal of any native oxide on the surface of silicon substrate 22 using strontium, barium, a combination of strontium and barium or other alkaline earth metals or a combination of alkaline earth metals and the preparation of silicon substrate 22 for growth of a monocrystalline oxide layer with reference to FIGS. 1–3 may be used (20).

Following the removal of the silicon oxide from the surface of the substrate, in accordance with one embodiment of the invention, the temperature of the substrate is adjusted to be within the range of about 200–600° C., more preferably within the range of about 250–450° C., and most preferably within the range of about 300–400° C. (30) and a layer of $ABO_3$ is grown on the template layer by MBE. The MBE process is initiated by first introducing oxygen, then opening shutters in the MBE apparatus to expose the alkaline earth metal A and the metal B (co deposition). The initial ratio of the alkaline earth metal A to the metal B is greater than 1 (40). In addition, growing the metal oxide layer under alkaline earth metal-rich conditions avoids the formation of metal B-rich reconstruction, a surface phase that is less favorable for initial metal oxide film growth on semiconductors. The partial pressure of oxygen is initially set in the range of from about $1 \times 10^{-9}$ to about $8 \times 10^{-8}$ Torr, preferably in the range of from about $5 \times 10^{-9}$ to about $5 \times 10^{-8}$ Torr (50). The partial pressure of oxygen however depends on the growth rate of the film—if the growth rate increases, the oxygen partial pressure should be increased accordingly. The low oxygen pressure may significantly reduce, if not eliminate, the formation of disordered substrate-oxide surface phases at early stages of the metal oxide growth. This low pressure, low temperature process significantly limits the substrate oxidation and allows high quality metal oxide films to be grown on vicinal substrates before they are oxidized.

Once the film reaches an adequate thickness, for example, at least 20 Å thick, preferably greater than 40 Å, the film is sufficiently stable and the oxidation of the underneath Si will not degrade the film quality. At this point, the ratio of the alkaline earth metal A to the metal B can be adjusted to approximately 1:1 so that the rest of the $ABO_3$ film can be grown stoichiometrically. Additionally, the partial pressure of oxygen and the growth temperature can be increased to ensure that the film is fully oxidized and the film crystallinity remains satisfactory.

It will be appreciated that this low pressure, low temperature method may also be used to grow epitaxial metal oxides layers (26, 106) overlying other monocrystalline metal oxide layers on monocrystalline substrates. For example, this process can be used to grow $SrTiO_3$ overlying a layer of $Sr_xBa_{1-x}TiO_3$, where x ranges from 0 to 1. Various combinations of these metal oxides can be used to form, for example, high-k materials suitable for use in microelectronic device formation.

In another embodiment, the partial pressure of oxygen may be increased above the initial minimum value after initiating the growth of the $ABO_3$ layer. The stoichiometry of the metal oxide film can be controlled during growth by monitoring RHEED patterns and adjusting the metal fluxes. The overpressure of oxygen causes the growth of an amorphous oxide layer at the interface between the underlying substrate and the $ABO_3$ layer (60). This step may be applied either during or after the growth of the $ABO_3$ layer. The growth of the amorphous oxide layer results from the diffusion of oxygen through the $ABO_3$ layer to the interface where the oxygen reacts with the substrate at the surface of the underlying substrate. The $ABO_3$ layer grows as an ordered (100) monocrystal with the (100) crystalline orientation rotated by 45°.

After the $ABO_3$ layer has been grown to a desired thickness, the process may proceed as previously described for formation of semiconductor devices. The monocrystalline $ABO_3$ layer may be capped by a template layer that is conducive to the subsequent growth of an epitaxial layer of a desired monocrystalline material (70).

A structure, such as structure 34 illustrated in FIG. 3, may also be formed by growing an accommodating buffer layer 24 using the above-described process for growing the $ABO_3$ layer.

It will be appreciated that, while the above example illustrates an embodiment of the process of the present invention using a metal oxide formed of an alkaline earth metal A and a metal B, the process of the present invention may be used to grow a variety of other metal oxide layers on vicinal substrates. To grow metal oxides that do not comprise an alkaline earth metal, it may be desirable to expose the substrate to an alkaline earth metal source during formation of the metal oxide to facilitate oxidation of the metal. The following example illustrates a process, in accordance with one embodiment of the invention, for forming an epitaxial layer of $LaAlO_3$ overlying a vicinal substrate in the presence of a small amount of alkaline earth metal.

The process starts by providing a monocrystalline semiconductor substrate comprising silicon or germanium (10). In accordance with a preferred embodiment of the invention, the semiconductor substrate is a silicon wafer having a (100) orientation. The substrate is oriented on axis or, at most, about 6° off axis, and preferably is misoriented 1–3° off axis toward the [110] direction. The process previously described for removal of any native oxide on the surface of silicon substrate 22 using strontium, barium, a combination of strontium and barium or other alkaline earth metals or a combination of alkaline earth metals and the preparation of silicon substrate 22 for growth of a monocrystalline oxide layer with reference to FIGS. 1–3 may be used (20).

Following the removal of the silicon oxide from the surface of the substrate, in accordance with one embodiment of the invention, the temperature of the substrate is adjusted to be within the range of about 200–600° C., more preferably within the range of about 250–450° C., and most preferably within the range of about 300–400° C., and a layer of $LaAlO_3$ is grown on the template layer by MBE. The MBE process is initiated by first introducing oxygen, then opening shutters in the MBE apparatus to expose the lanthanum and the aluminum sources. In addition, the substrate should also be exposed to a source of alkaline earth metal, such as, for example, magnesium, strontium or barium, to facilitation oxidation of the aluminum. The alkaline earth metal may comprise approximately 0.1% to 10% of the total flux to the substrate.

After initiating growth of the alkaline earth doped $LaAlO_3$ layer, the partial pressure of oxygen may be increased above the initial minimum value. The overpressure of oxygen causes the growth of an amorphous interface layer at the interface between the underlying substrate and the doped $LaAlO_3$ layer. This step may be applied either during or after the growth of the $LaAlO_3$ layer. The growth of the amorphous interface layer results from the diffusion of oxygen through the doped $LaAlO_3$ layer to the interface where the oxygen reacts with the silicon at the surface of the underlying substrate. The $LaAlO_3$ layer grows as an ordered (100) monocrystal with the (100) crystalline orientation rotated by 45°.

After the alkaline earth doped $LaAlO_3$ layer has been grown to a desired thickness, the process may proceed as previously described. The monocrystalline $LaAlO_3$ layer may be capped by a template layer that is conducive to the subsequent growth of an epitaxial layer of a desired monocrystalline material.

The processes described above illustrate processes for forming layers on vicinal surfaces using MBE. However, the processes can also be carried out using CVD, MOCVD, MEE, ALE, PVD, CSD, PLD and the like. Further, it will be appreciated that, by similar processes, a variety of monocrystalline accommodating buffer layers such as alkaline earth metal titanates, zirconates, hafnates, tantalates, vanadates, ruthenates, niobates, alkaline earth metal tin-based perovskites, lanthanum aluminate, lanthanum scandium oxide, and gadolinium oxide can also be grown. In addition, by similar processes, other monocrystalline material layers comprising other III-V, II-VI, and IV-VI monocrystalline compound semiconductors, semiconductors, metals and non-metals can be deposited overlying the monocrystalline metal oxide accommodating buffer layer.

As should now be appreciated, semiconductor structures and devices in accordance with various embodiments of the present invention may be fabricated using a low temperature, low pressure, alkaline earth metal-rich process for growing high quality epitaxial metal oxide layers overlying monocrystalline substrates, including vicinal substrates.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential features or elements of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

We claim:

1. A process for forming an epitaxial $ABO_3$ oxide layer overlying a monocrystalline substrate, the oxide layer comprising an alkaline earth metal A and a B metal, said process comprising:

providing a monocrystalline substrate;

establishing a temperature of said monocrystalline substrate within a range of from about 250° C. to about 450° C.;

exposing said monocrystalline substrate to a partial pressure of oxygen in the range of from about $1\times10^{-9}$ to about $8\times10^{-8}$ Torr; and exposing said monocrystalline substrate to at least one source of said alkaline earth metal A and to at least one source of said metal B such that a ratio of said alkaline earth metal A to said metal B is greater than one.

2. The process of claim 1, wherein said step of providing a monocrystalline substrate comprises providing a vicinal surface.

3. The process of claim 1, wherein the step of exposing said monocrystalline substrate to a partial pressure of oxygen includes increasing said partial pressure of oxygen as a growth of the oxide layer increases.

4. The process of claim 1, wherein the step of establishing includes setting said temperature within a range of from about 300° C. to about 400° C.

5. The process of claim 1, wherein the step of providing a monocrystalline substrate comprises providing a substrate selected from the group consisting of silicon, germanium, and mixed silicon and germanium.

6. The process of claim 1, wherein the epitaxial oxide layer is selected from one of alkaline earth metal titanates, alkaline earth metal zirconates, alkaline earth metal hafnates, alkaline earth metal tantalates, alkaline earth metal ruthenates, alkaline earth metal niobates, alkaline earth metal vanadates, and alkaline earth metal tin-based perovskites.

7. The process of claim 1, further comprising the step of forming an amorphous interface layer overlying said monocrystalline substrate and underlying the epitaxial oxide layer.

8. The process of claim 1, wherein the step of exposing said monocrystalline substrate to a partial pressure of oxygen includes providing a partial pressure of oxygen in the range of about $5 \times 10^{-9}$ to about $5 \times 10^{-8}$ Torr.

* * * * *